(12) United States Patent
Morita

(10) Patent No.: US 9,859,598 B2
(45) Date of Patent: Jan. 2, 2018

(54) ELECTRONIC CIRCUIT

(71) Applicant: CANON KABUSHIKI KAISHA, Tokyo (JP)

(72) Inventor: Jun Morita, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 35 days.

(21) Appl. No.: 14/873,774

(22) Filed: Oct. 2, 2015

(65) Prior Publication Data

US 2016/0104927 A1    Apr. 14, 2016

(30) Foreign Application Priority Data

Oct. 10, 2014    (JP) .................................. 2014-209394

(51) Int. Cl.
| | | |
|---|---|---|
| H01P 1/203 | (2006.01) | |
| H03H 7/01 | (2006.01) | |
| H01P 3/08 | (2006.01) | |
| H01P 1/20 | (2006.01) | |
| H03H 1/00 | (2006.01) | |

(52) U.S. Cl.
CPC ............ H01P 1/203 (2013.01); H01P 1/2005 (2013.01); H01P 1/2039 (2013.01); H01P 3/081 (2013.01); H01P 3/082 (2013.01); H03H 7/01 (2013.01); *H03H 2001/0085* (2013.01)

(58) Field of Classification Search
CPC .. H03H 3/08; H03H 3/082; H03H 2001/0085; H03H 7/01; H01P 1/203; H01P 3/08; H01P 3/082; H01P 1/2005

USPC .......................... 333/175, 185, 204, 238, 246
See application file for complete search history.

(56) References Cited

U.S. PATENT DOCUMENTS

| | | | | |
|---|---|---|---|---|
| 8,547,188 | B2 * | 10/2013 | Plager | H01P 1/20345 333/185 |
| 2002/0093397 | A1 * | 7/2002 | Nosaka | H03H 7/09 333/185 |
| 2003/0020568 | A1 * | 1/2003 | Mizutani | H01P 1/20381 333/204 |
| 2007/0205851 | A1 * | 9/2007 | Fukunaga | H01P 1/20345 333/204 |
| 2011/0316652 | A1 * | 12/2011 | Satoh | H01P 1/20345 333/204 |

FOREIGN PATENT DOCUMENTS

JP    2012-186724 A    9/2012

* cited by examiner

*Primary Examiner* — Rakesh Patel
(74) *Attorney, Agent, or Firm* — Carter, DeLuca, Farrell & Schmidt, LLP

(57) ABSTRACT

An electronic circuit includes at least two first conductors having line shapes which are arranged on a first plane of a substrate, a second conductor arranged on a second plane of the substrate, and a third conductor having a line shape, with at least part thereof being arranged on a third plane between the first plane and the second plane of the substrate. The open end of the third conductor is included in part of the third conductor which is arranged on the third plane, and the part is arranged to at least partly overlap one of at least the two first conductors and not to overlap the other first conductor when viewed from a direction perpendicular to the substrate.

20 Claims, 24 Drawing Sheets

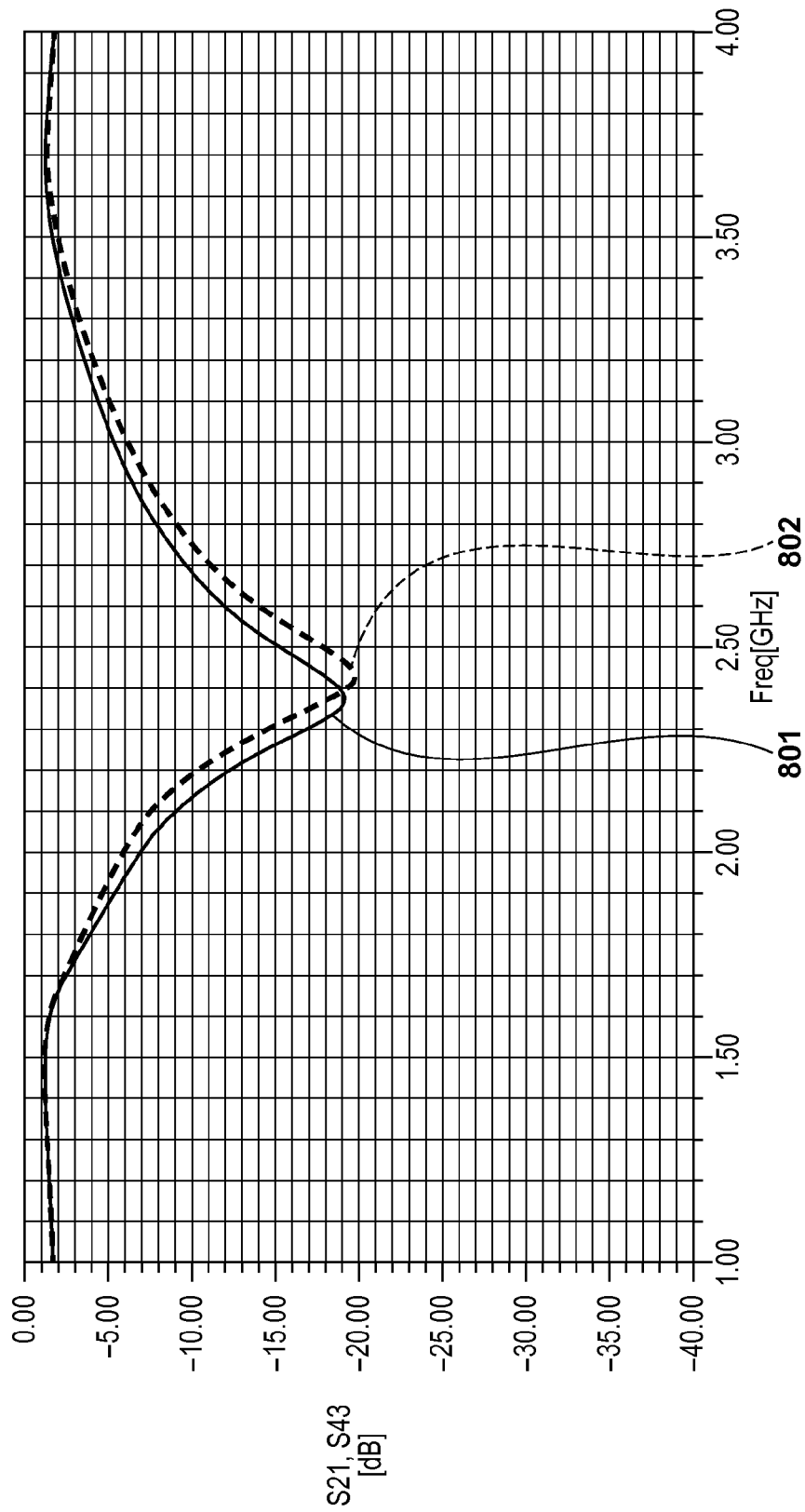

ELECTRONIC CIRCUIT

BACKGROUND OF THE INVENTION

Field of the Invention

The present invention relates to an electronic circuit having an electromagnetic band gap structure.

Description of the Related Art

Recently, studies have been made on an EBG (Electromagnetic Band Gap) structure which prevents the propagation of electromagnetic waves in a specific frequency band. For example, an electromagnetic band gap structure has an arrangement having an open stub inserted between parallel plates. In addition, Japanese Patent Laid-Open No. 2012-186724 discloses a compact electromagnetic band gap structure having an open stub connected to a transmission line, with the open stub being formed by using a plurality of layers.

Conventionally, however, in a state in which signal lines are densely arranged, the same EBG structure may simultaneously act on a plurality of signal lines to result in the propagation of electromagnetic waves to the plurality of signal lines through the EBG structure. If an electronic circuit is designed to prevent one EBG structure from acting on a plurality of signal lines in consideration of such a case, heavier restrictions are imposed on the design of an electronic circuit.

The present invention provides an electronic circuit having a compact EBG structure which independently acts on each of a plurality of signal lines.

SUMMARY OF THE INVENTION

According to one aspect of the present invention, there is provided an electronic circuit comprising: at least two first conductors having line shapes which are arranged on a first plane of a substrate; a second conductor arranged on a second plane of the substrate; and a third conductor having a line shape, with at least part thereof being arranged on a third plane between the first plane and the second plane of the substrate, wherein the third conductor is arranged such that the part, in the third plane, at least partly overlaps one first conductor of the at least two first conductors and does not overlap the other first conductor when viewed from a direction perpendicular to the substrate, while the part includes an open end of the third conductor.

According to another aspect of the present invention, there is provided an electronic circuit comprising: at least two first conductors having line shapes which are arranged on a first plane of a substrate; a second conductor arranged on a second plane of the substrate; and a third conductor having a line shape arranged between the first plane and the second plane of the substrate, wherein one of end portions of the third conductor is connected to one of the at least two first conductors and the other of the end portions is an open end which is arranged nearer to the second plane than the first plane.

According to still another aspect of the present invention, there is provided an electronic circuit comprising: at least two first conductors having line shapes which are arranged on a first plane of a substrate; a second conductor arranged on the second plane of the substrate; and a third conductor having a line shape, with at least part thereof being arranged on a third plane between the first plane and the second plane of the substrate, wherein two end portions of the third conductor are connected to the second conductor, and the part is arranged on the third plane to at least partly overlap one of the at least two first conductors and not to overlap the other first conductor when viewed from a direction perpendicular to the substrate.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

FIG. 8 is a graph showing the transmission coefficients of electromagnetic waves transmitted through signal lines in the circuit in FIGS. 7A to 7C;

DESCRIPTION OF THE EMBODIMENTS

An exemplary embodiment(s) of the present invention will now be described in detail with reference to the drawings. It should be noted that the relative arrangement of the components, the numerical expressions and numerical values set forth in these embodiments do not limit the scope of the present invention unless it is specifically stated otherwise.

First Embodiment

An electronic circuit substrate is generally constituted by a plurality of layers. For example, a transmission line such as a microstrip line has a signal line and a ground conductor arranged on difference layers and transmits a signal. In addition, a plurality of microstrip lines are densely arranged on a compact electronic circuit substrate. In such an electronic circuit substrate, noise may mix in signal lines and propagate through the electronic circuit substrate. In contrast to this, using an EBG (Electromagnetic Band Gap) structure can suppress noise which mixes in a plurality of signal lines, in particular, the propagation of electromagnetic waves in a specific frequency band.

An EBG structure has a conductor between the first plane on which signal lines are arranged and the second plane which is parallel to the first plane and on which a ground conductor is arranged, with one end of the conductor being connected to the ground conductor and the other end being an open end. This conductor structure prevents the propagation of an electromagnetic wave having an electrical length $\lambda$ when the conductor length of the conductor arranged between the first and second planes is $\lambda/4$. In this case, in a structure having one EBG structure simultaneously coupled to a plurality of signal lines, electromagnetic waves propagate to adjacent signal lines through the EBG structure. For this reason, in this embodiment, an electronic circuit including an EBG structure is configured to prevent the propagation of electromagnetic waves to adjacent signal lines which are densely arranged.

Figure 1A:
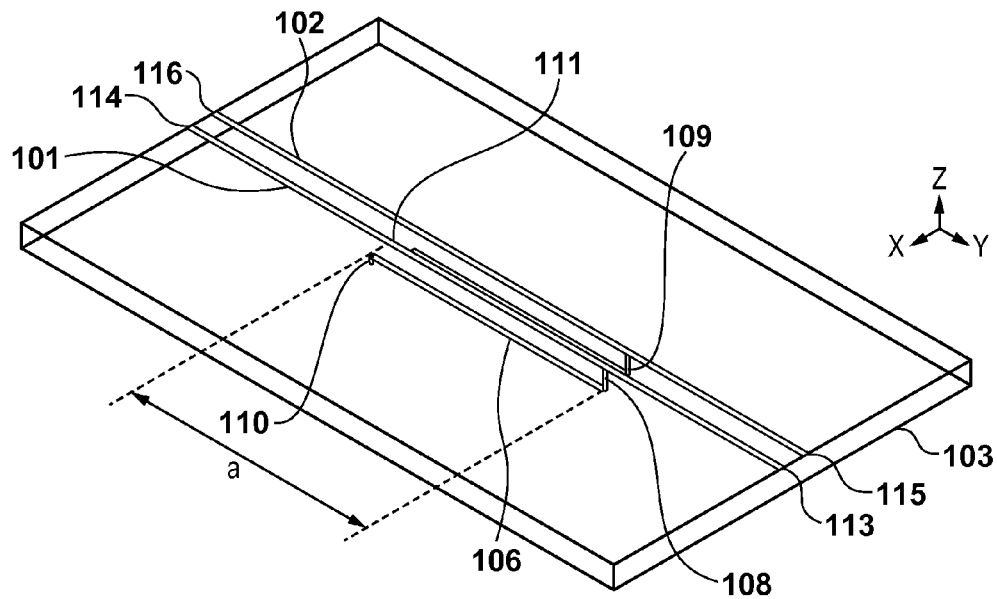
FIGS. 1A to 1C are schematic views, enlarged sectional view, and enlarged plan view, respectively, of an electronic circuit according to the first embodiment.
Figure 1B:
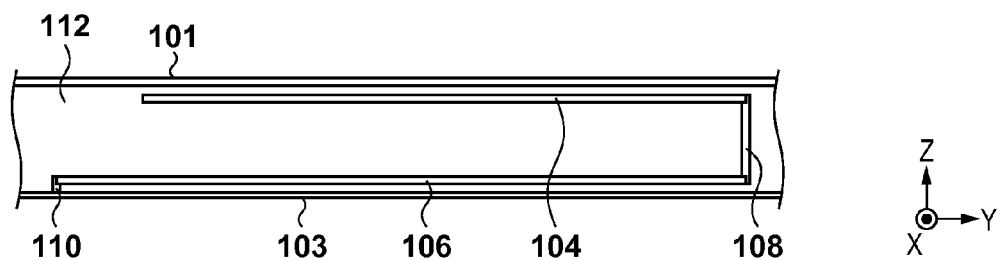
Figure 1C:
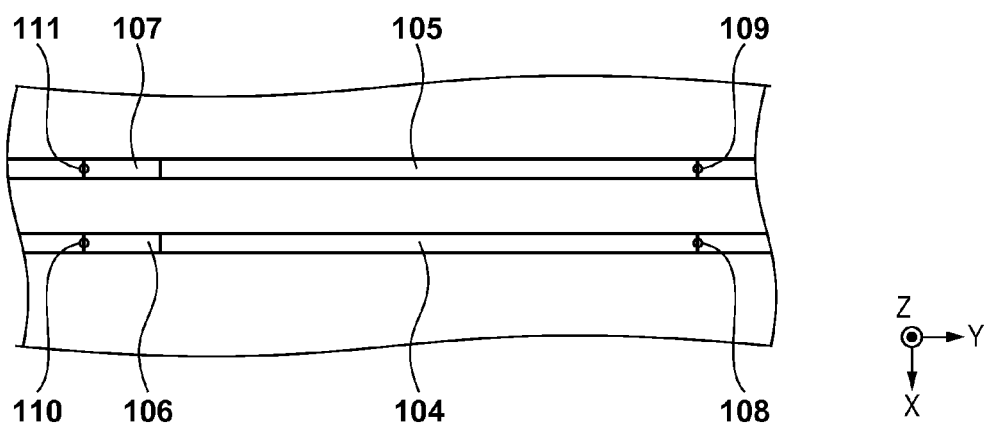

FIGS. 1A to 1C are schematic views showing the arrangement of an electronic circuit including an EBG structure according to this embodiment. FIG. 1A is a schematic view showing the overall arrangement of the electronic circuit. FIG. 1B is an enlarged sectional view of the EBG structure portion in FIG. 1A. FIG. 1C is an enlarged plan view of the EBG structure portion in FIG. 1A. Note that the embodiment will exemplify an EBG structure which operates in a frequency band of 2.4 GHz to 2.5 GHz which is used for a wireless LAN (IEEE802.11b/g/n). Assume also that the EBG structure according to the embodiment is arranged on a general four-layer printed substrate.

As shown in FIGS. 1A to 1C, the electronic circuit according to this embodiment includes signal lines 101 and 102 each having a line shape, a ground conductor 103, conductors 104 to 107 each having a line shape, conductor vias 108 to 111, and a dielectric 112. More specifically, the signal lines 101 and 102 are arranged on the first layer of the printed substrate, the conductors 104 and 105 are arranged on the second layer, the conductors 106 and 107 are arranged on the third layer, and the ground conductor 103 is arranged on the fourth layer. The ground conductor 103 and the conductor 106 are connected to each other through the conductor via 110. The conductors 106 and 104 are connected to each other through the conductor via 108. In addition, the ground conductor 103 and the conductor 107 are connected to each other through the conductor via 111. The conductors 107 and 105 are connected to each other through the conductor via 109.

The conductors 104 and 105 of the EBG structure in FIGS. 1A to 1C each are arranged to overlap only a corresponding one of the signal lines 101 and 102 arranged adjacent to each other, when viewed from a direction perpendicular to the substrate surface, so as to be independently coupled to (to independently act on) a corresponding one of the signal lines 101 and 102. That is, the conductor 104 is arranged so as to overlap the signal line 101, to which the conductor 104 corresponds, but not to overlap the signal line 102, to which the conductor 104 does not correspond, when viewed from the direction perpendicular to the substrate surface. Likewise, the conductor 105 is arranged so as to overlap the signal line 102 but not to overlap the signal line 101 when viewed from the direction perpendicular to the substrate surface. In addition, the conductor 106 and 107 each are arranged to overlap only a corresponding one of the signal lines 101 and 102 when viewed from the direction perpendicular to the substrate surface. Note that if the EBG structure in FIGS. 1A to 1C (the conductors 104 to 107 and the conductor vias 108 to 111) is designed to cut off electromagnetic waves of 2.4 GHz to 2.5 GHz, a length a of the EBG structure in the Y-axis direction is 8 mm.

Figure 2:
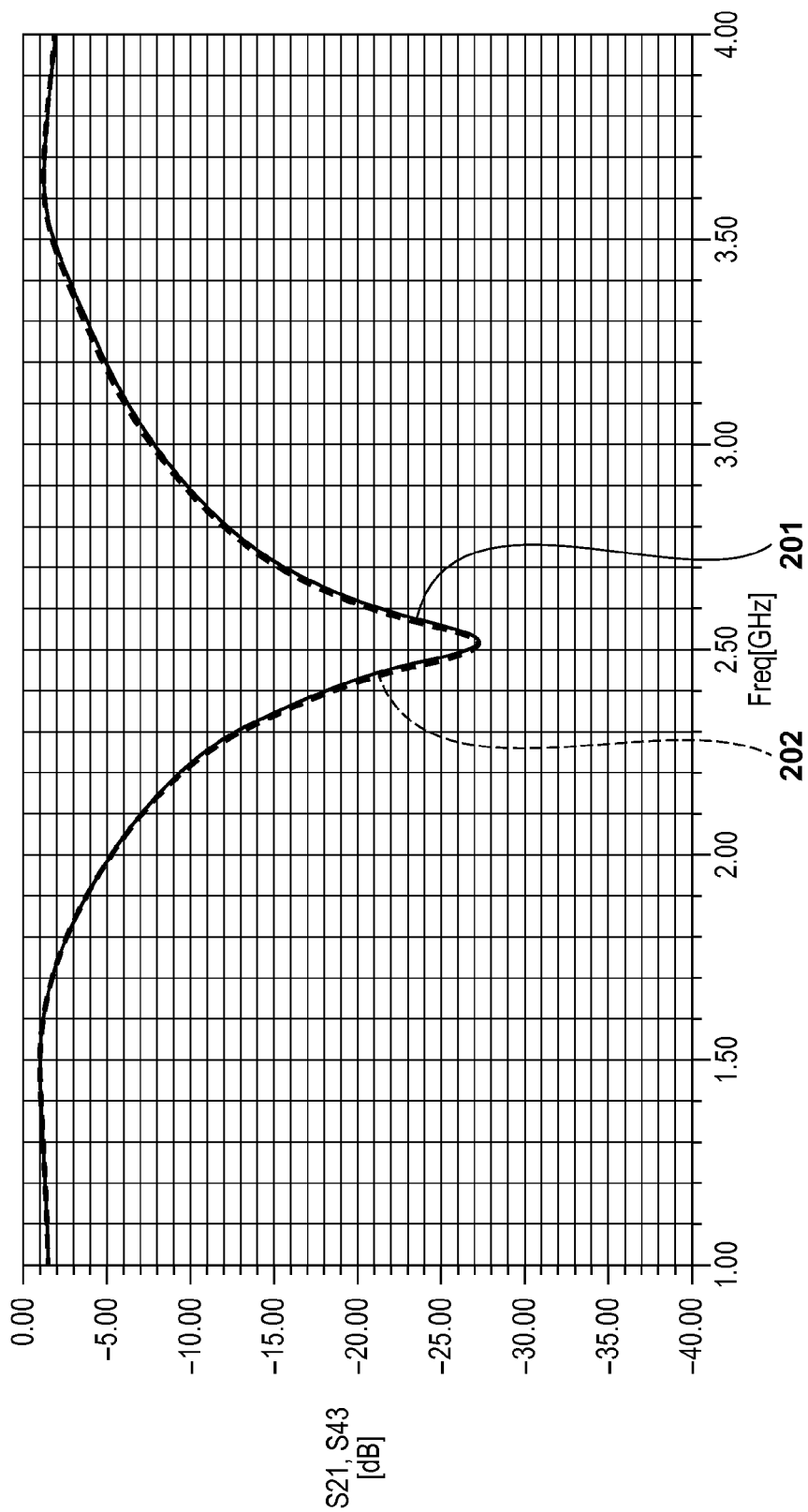
FIG. 2 is a graph showing the transmission coefficients of electromagnetic waves transmitted through signal lines in the circuit in FIGS. 1A to 1C.

The arrangement in FIGS. 1A to 1C has, as the signal input and output terminals of the signal line 101, a terminal portion 113 in the positive Y-axis direction as port 1 and a terminal portion 114 in the negative Y-axis direction as port 2. This arrangement also has, as the signal input and output terminals of the signal line 102, a terminal portion 115 in the positive Y-axis direction as port 3 and a terminal portion 116 in the negative Y-axis direction as port 4. In this case, FIG. 2 shows analysis results on a transmission coefficient S21 of electromagnetic waves propagating between ports 1 and 2 in the Y-axis direction and a transmission coefficient S43 of electromagnetic waves propagating between ports 3 and 4 in the Y-axis direction. Referring to FIG. 2, a solid curve denoted by reference numeral 201 indicates the analysis result on S21, and a broken curve denoted by reference numeral 202 indicates the analysis result on S43. It is obvious from FIG. 2 that in the arrangement in FIGS. 1A to 1C, since both the transmission coefficients S21 and S43 indicate about −27 dB in the 2.4 GHz band, electromagnetic waves propagating through the signal lines are sufficiently attenuated in the 2.4 GHz band.

Figure 3:
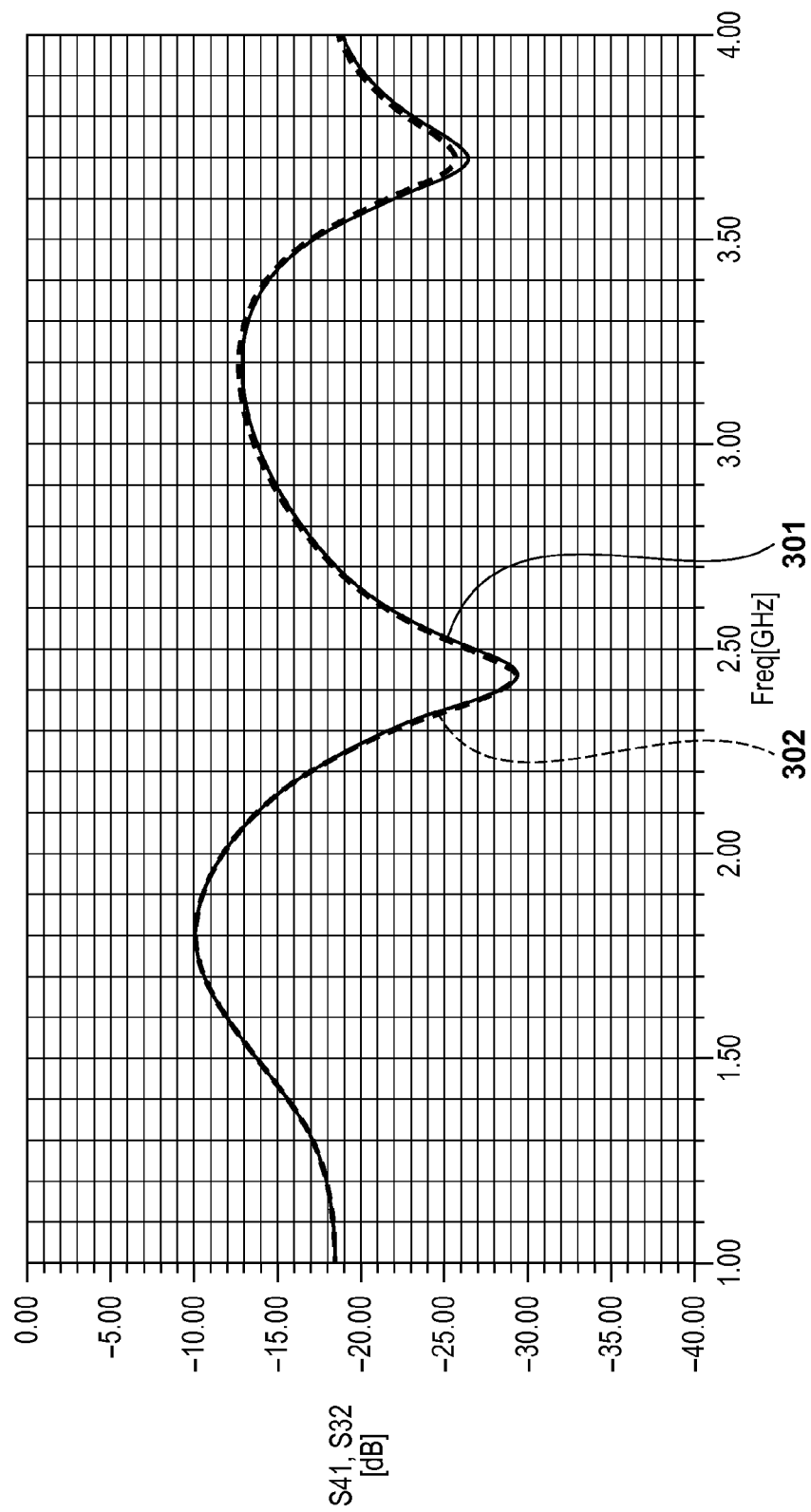
FIG. 3 is a graph showing the transmission coefficients of electromagnetic waves transmitted through adjacent signal lines in the circuit in FIGS. 1A to 1C.

FIG. 3 shows analysis results on a transmission coefficient S41 of electromagnetic waves propagating between port 1 of the signal line 101 and port 4 of the signal line 102 and a transmission coefficient S32 of electromagnetic waves propagating between port 2 of the signal line 101 and port 3 of the signal line 102. Referring to FIG. 3, a solid curve denoted by reference numeral 301 indicates the analysis result on S41, and a broken curve denoted by reference numeral 302 indicates the analysis result on S32. It is obvious from FIG. 3 that in the arrangement in FIGS. 1A to 1C, since both S41 and S32 indicate about −29 dB in the 2.4 GHz band, almost no electromagnetic waves propagate to the adjacent signal lines.

In the related art, if an EBG structure is coupled to a plurality of signal lines, electromagnetic waves propagate to the adjacent signal lines. In contrast to this, in this embodiment, as shown in FIGS. 1A to 1C, the conductors 104 and 105 on the layer immediately near the signal lines 101 and 102 each are arranged to overlap only one signal line. As a result, conductors constituting an EBG structure each are coupled to only one signal line but not coupled to the adjacent signal line so that no electromagnetic waves propagate to the adjacent signal lines.

Note that in the arrangement in FIGS. 1A to 1C, the conductors 104 and 105 are arranged to entirely overlap the signal lines 101 and 102, respectively. However, only part of each conductor may overlap a corresponding one of the signal lines. In addition, in order to ensure a sufficient conductor length of each of the conductors 104 and 105, each of the conductors 104 and 105 may be formed into a shape such as a meander shape or spiral shape in the structure in FIGS. 1A to 1C. In addition, although the signal lines 101 and 102 are formed on the first layer (front surface) of the substrate in the arrangement in FIGS. 1A to 1C, the signal lines may be arranged on an inner layer instead of the front or back surface of the substrate.

Second Embodiment

The first embodiment has exemplified the arrangement which suppresses electromagnetic waves in a predetermined frequency band without making electromagnetic waves propagate to adjacent signal lines by coupling one EBG structure to only one signal line. In the second embodiment, conductor portions, of an EBG structure, which are formed on a layer distant from signal lines are arranged to overlap the adjacent signal lines, thereby substantially coupling the EBG structure to only one signal line and further downsizing the circuit.

Figure 4A:
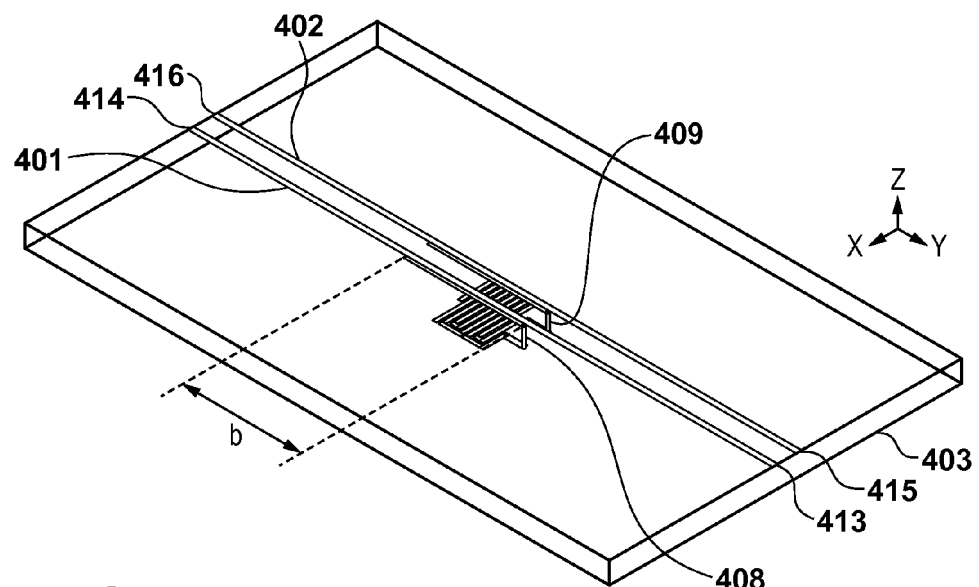
FIGS. 4A to 4C are schematic views, enlarged sectional view, and enlarged plan view, respectively, of an electronic circuit according to the second embodiment.
Figure 4B:
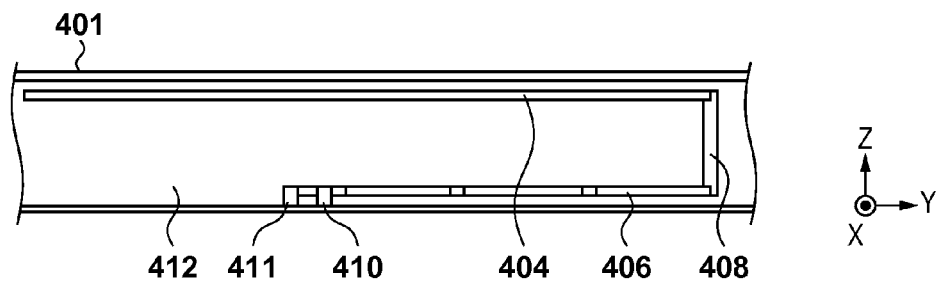
Figure 4C:
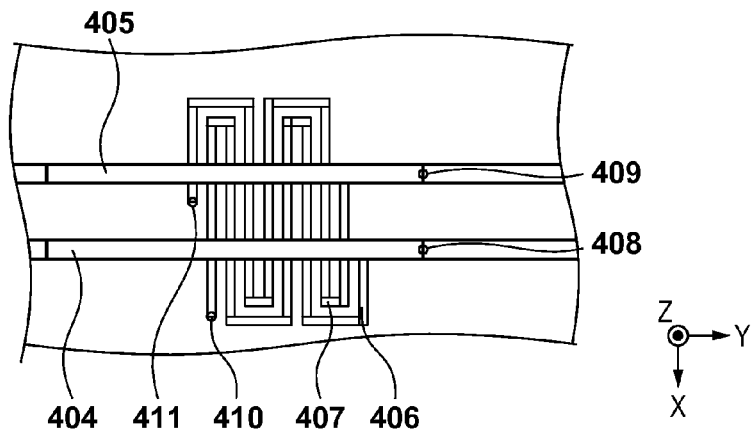

FIGS. 4A to 4C are schematic views showing the arrangement of an electronic circuit including an EBG structure according to this embodiment. FIG. 4A is a schematic view showing the overall arrangement of the electronic circuit. FIG. 4B is an enlarged sectional view of the EBG structure portion in FIG. 4A. FIG. 4C is an enlarged plan view of the EBG structure portion in FIG. 4A.

As shown in FIGS. 4A to 4C, the electronic circuit according to this embodiment includes signal lines 401 and 402 each having a line shape, a ground conductor 403, conductors 404 to 407 each having a line shape, conductor vias 408 to 411, and a dielectric 412. More specifically, the signal lines 401 and 402 are arranged on the first layer of the printed substrate, the conductors 404 and 405 are arranged on the second layer, the conductors 406 and 407 are arranged on the third layer, and the ground conductor 403 is arranged on the fourth layer. The ground conductor 403 and the conductor 406 are connected to each other through the conductor via 410. The conductors 406 and 404 are connected to each other through the conductor via 408. In addition, the ground conductor 403 and the conductor 407 are connected to each other through the conductor via 411. The conductors 407 and 405 are connected to each other through the conductor via 409.

The conductors 404 and 405 of the EBG structure in FIGS. 4A to 4C each are arranged to cover a corresponding one of the signal lines 401 and 402 arranged adjacent to each other, when viewed from a direction perpendicular to the substrate surface, so as to be independently coupled to (to independently act on) a corresponding one of the signal lines 402 and 402. That is, the conductor 404 is arranged so as to overlap the signal line 401 to which the conductor 404 corresponds but not to overlap the signal line 402 to which the conductor 404 does not correspond when viewed from the direction perpendicular to the substrate surface. Likewise, the conductor 405 is arranged to overlap the signal line 402 but not to overall the signal line 401 when viewed from the direction perpendicular to the substrate surface.

On the other hand, the conductors 406 and 407 are arranged to partly overlap the both signal lines 401 and 402 when viewed from the direction perpendicular to the substrate surface. That is, in this embodiment, although the conductors 404 and 405 each are arranged on the second layer near the first layer, on which the signal lines are arranged, so as to overlap only a corresponding one of the signal lines 401 and 402. However, such arrangement restrictions are not imposed on the third layer distant from the first layer. Even in this arrangement, the distance between the conductors formed on the third layer and the signal lines formed on the first layer is sufficiently large, and hence the electromagnetic coupling between them is sufficiently reduced. This can prevent the transmission of electromagnetic waves to be cut off between adjacent signal lines. In the case in FIGS. 4A to 4C, the conductors 406 and 407 each are formed into a meander shape on the third layer, and have both a portion overlapping the signal line 401 and a portion overlapping the signal line 402 when viewed from the direction perpendicular to the substrate surface. Note that if the EBG structure in FIGS. 4A to 4C (the conductors 404 to 407 and the conductor vias 408 to 411) is designed to cut off electromagnetic waves of 2.4 GHz to 2.5 GHz, a length b of the EBG structure in the Y-axis direction is 4 mm. As described above, the EBG structure according to this embodiment is downsized in the Y-axis direction as compared with the EBG structure according to the first embodiment.

Figure 5:
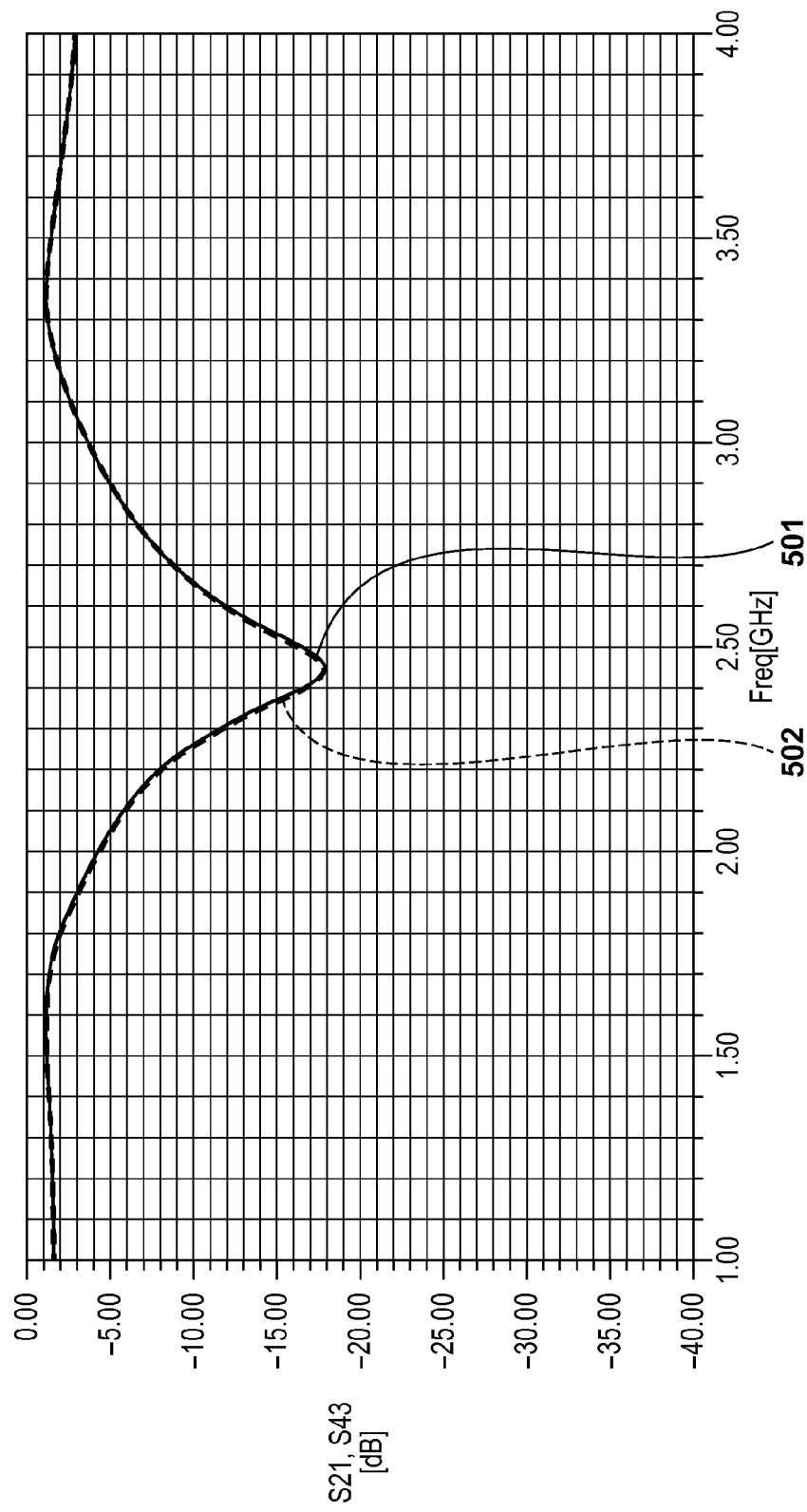
FIG. 5 is a graph showing the transmission coefficients of electromagnetic waves transmitted through signal lines in the circuit in FIGS. 4A to 4C.

The arrangement in FIGS. 4A to 4C has, as the signal input and output terminals of the signal line 401, a terminal portion 413 in the positive Y-axis direction as port 1 and a terminal portion 414 in the negative Y-axis direction as port 2. This arrangement also has, as the signal input and output terminals of the signal line 402, a terminal portion 415 in the positive Y-axis direction as port 3 and a terminal portion 416 in the negative Y-axis direction as port 4. In this case, FIG. 5 shows analysis results on a transmission coefficient S21 of electromagnetic waves propagating between ports 1 and 2 in the Y-axis direction and a transmission coefficient S43 of electromagnetic waves propagating between ports 3 and 4 in the Y-axis direction. Referring to FIG. 5, a solid curve denoted by reference numeral 501 indicates the analysis result on S21, and a broken curve denoted by reference numeral 502 indicates the analysis result on S43. It is obvious from FIG. 5 that in the arrangement in FIGS. 4A to 4C, since both the transmission coefficients S21 and S43 indicate about −18 dB in the 2.4 GHz band, electromagnetic waves propagating through the signal lines are sufficiently attenuated in the 2.4 GHz band.

Figure 6:
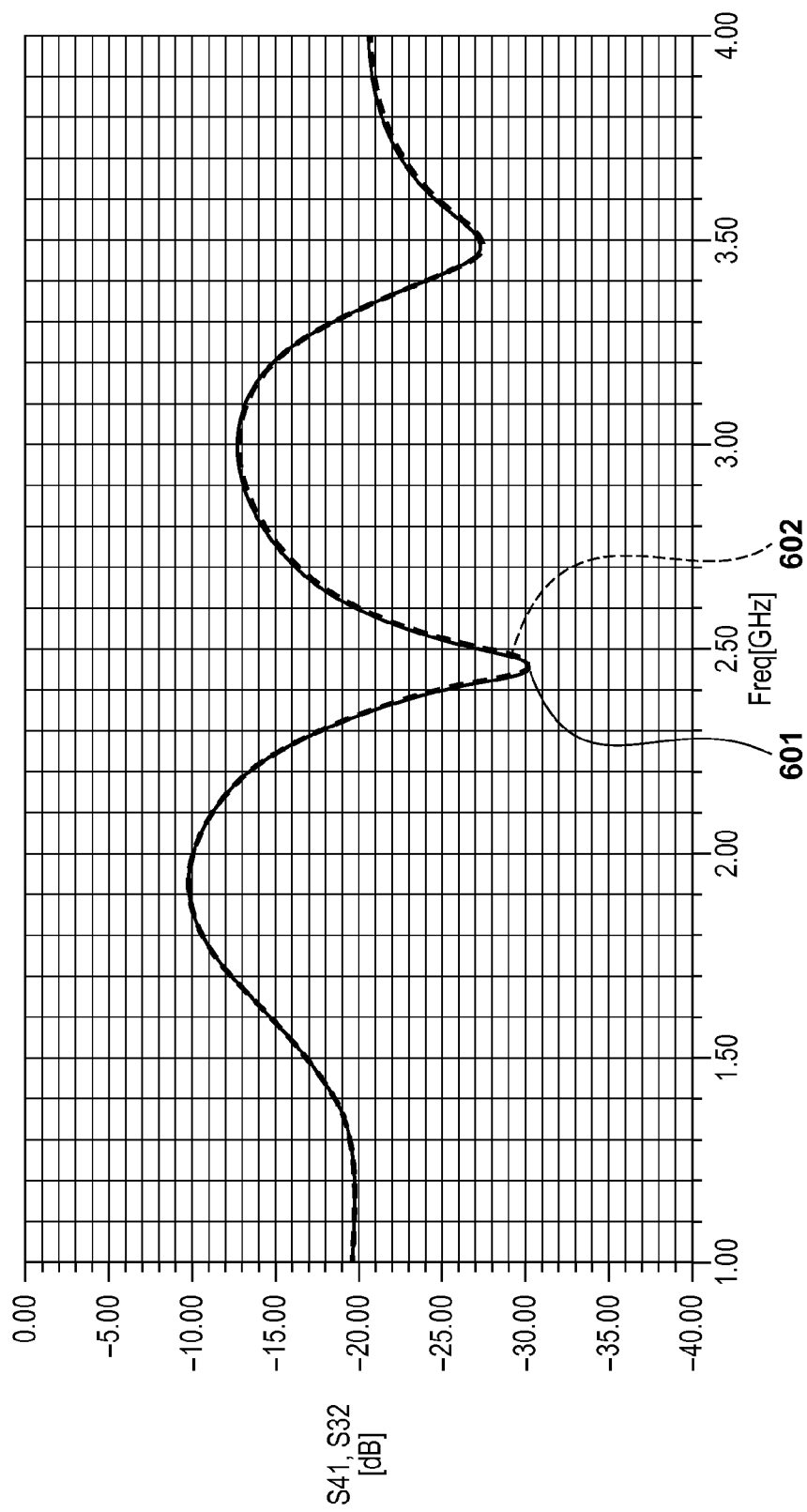
FIG. 6 is a graph showing the transmission coefficients of electromagnetic waves transmitted through adjacent signal lines in the circuit in FIGS. 4A to 4C.

FIG. 6 shows analysis results on a transmission coefficient S41 of electromagnetic waves propagating between port 1 of the signal line 401 and port 4 of the signal line 402 and a transmission coefficient S32 of electromagnetic waves propagating between port 2 of the signal line 401 and port 3 of the signal line 402. Referring to FIG. 6, a solid curve denoted by reference numeral 601 indicates the analysis result on S41, and a broken curve denoted by reference numeral 602 indicates the analysis result on S32. It is obvious from FIG. 6 that in the arrangement in FIGS. 4A to 4C, since both S41 and S32 indicate about −30 dB in the 2.4 GHz band, almost no electromagnetic waves propagate to the adjacent signal lines.

As described above, in the electronic circuit according to this embodiment, the conductors 404 and 405 formed on the layer near the layer, on which the signal lines 401 and 402 are formed, each are arranged to overlap only one signal line when viewed from the direction perpendicular to the substrate surface but not to overlap the adjacent signal line. As a consequence, the conductor 404 is electromagnetically coupled to the signal line 401 but is not coupled to the signal line 402. Likewise, the conductor 405 is electromagnetically coupled to the signal line 402 but is not coupled to the signal line 401. In addition, the conductors 406 and 407 formed on the layer distant from the layer on which the signal lines 401 and 402 are arranged are allowed to overlap both the signal lines 401 and 402 when viewed from the direction perpendicular to the substrate surface. Since the conductors 406 and 407 are distant from the signal lines 401 and 402 in the Z-axis direction and are very weakly coupled to them, the conductors can be arranged to overlap a plurality of signal lines in this manner. For this reason, in the case in FIGS. 4A to 4C, the conductors 406 and 407 each have a meander shape to reduce the size of the EBG structure in the Y-axis direction. As described above, a circuit arrangement like that shown in FIGS. 4A to 4C can downsize an EBG structure which suppresses electromagnetic waves in a predetermined frequency band without making electromagnetic waves propagate to adjacent signal lines.

Figure 7A:
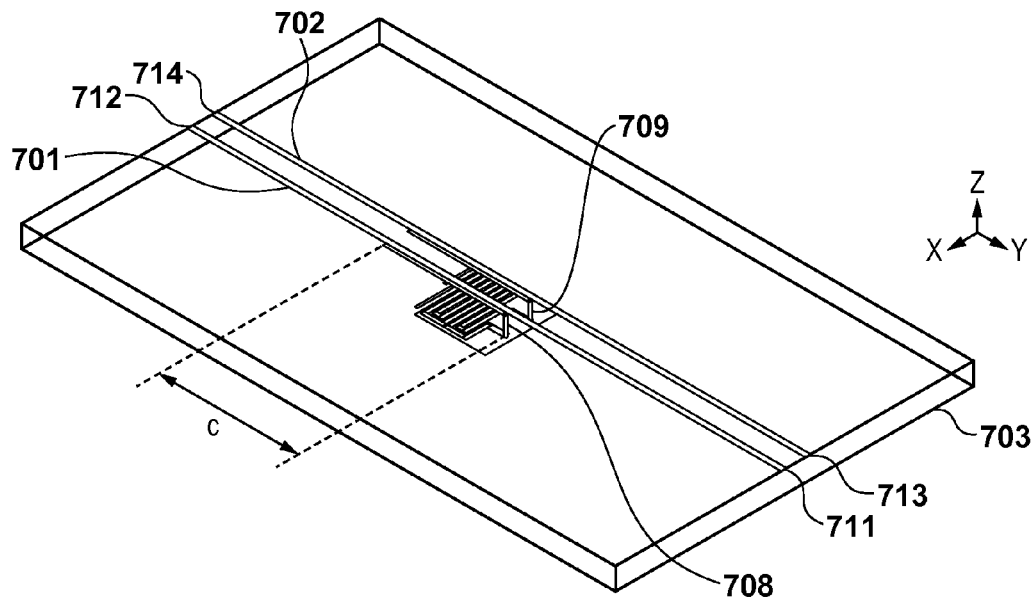
FIGS. 7A to 7C are schematic views, enlarged sectional view, and enlarged plan view, respectively, of another electronic circuit according to the third embodiment.
Figure 7B:
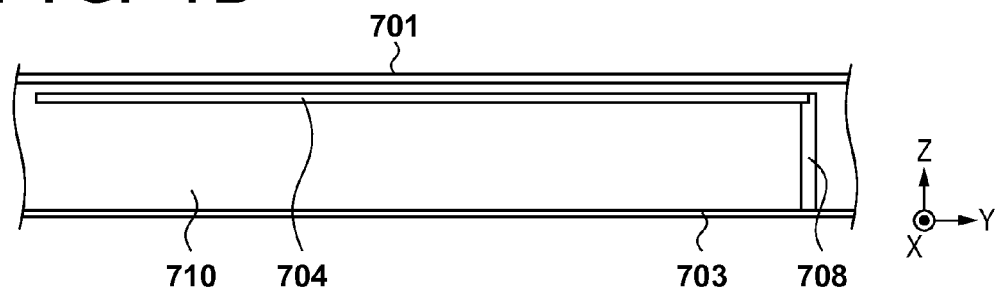
Figure 7C:
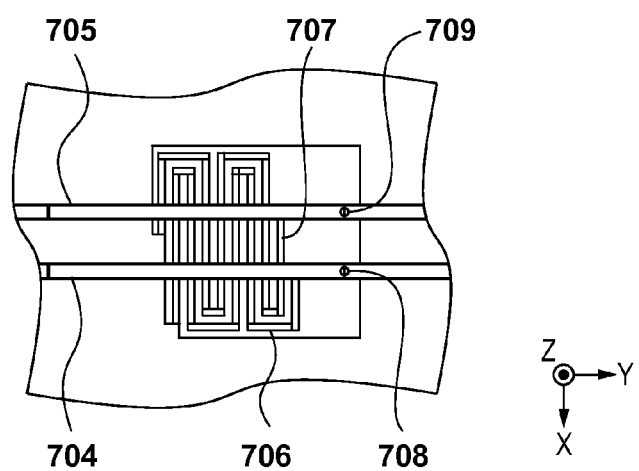

Note that in the arrangement shown in FIGS. 4A to 4C, the conductors 406 and 407 can be formed on the same layer on which the ground conductor 403 is formed. FIGS. 7A to 7C are views showing the arrangement of an electronic circuit having the conductors 406 and 407 in FIGS. 4A to 4C formed on the ground conductor 403. FIG. 7A is a schematic view showing the overall arrangement of the electronic circuit. FIG. 7B is an enlarged sectional view of the EBG structure portion in FIG. 7A. FIG. 7C is an enlarged plan view of the EBG structure portion in FIG. 7A.

The circuit arrangement in FIGS. 7A to 7C includes signal lines 701 and 702, a ground conductor 703, conductors 704 to 707, conductor vias 708 and 709, and a dielectric 710. More specifically, the signal lines 701 and 702 are arranged on the first layer of the printed substrate, the conductors 704 and 705 are arranged on the second layer, and the conductors 706 and 707 and the ground conductor 703 are arranged on the third layer. The conductors 706 and 704 are connected to each other through the conductor via 708. The conductors 707 and 705 are connected to each other through the conductor via 709. Note that the conductors 706 and 707 are not connected to the ground conductor 703 on the same layer. The arrangement in FIGS. 7A to 7C is basically the same as that in FIGS. 4A to 4C except that the conductors 706 and 707 are formed on the same layer on which the ground conductor 703 is formed. Therefore, the conductors 704 and 705 each are arranged to overlap only a corresponding one of the signal lines 701 and 702, when viewed from the direction perpendicular to the substrate surface, and not to overall the other signal line. On the other hand, no such restriction is imposed on the arrangement of the conductors 706 and 707. Therefore, as in the case in FIGS. 4A to 4C, it is possible to downsize the EBG structure in the Y-axis direction. In practice, if the EBG structure in FIGS. 7A to 7C is designed to cut off electromagnetic waves of 2.4 GHz to 2.5 GHz, a length c of the EBG structure in the Y-axis direction is 4 mm as in the case in FIGS. 4A to 4C.

The arrangement in FIGS. 7A to 7C has, as the signal input and output terminals of the signal line 701, a terminal portion 711 in the positive Y-axis direction as port 1 and a terminal portion 712 in the negative Y-axis direction as port 2. This arrangement also has, as the signal input and output terminals of the signal line 702, a terminal portion 713 in the positive Y-axis direction as port 3 and a terminal portion 714 in the negative Y-axis direction as port 4. In this case, FIG. 8 shows analysis results on a transmission coefficient S21 of electromagnetic waves propagating between ports 1 and 2 in the Y-axis direction and a transmission coefficient S43 of electromagnetic waves propagating between ports 3 and 4 in the Y-axis direction. Referring to FIG. 8, a solid curve denoted by reference numeral 801 indicates the analysis result on S21, and a broken curve denoted by reference numeral 802 indicates the analysis result on S43. It is obvious from FIG. 8 that in the arrangement in FIGS. 7A to 7C, since both the transmission coefficients S21 and S43 indicate about −20 dB in the 2.4 GHz band, electromagnetic waves propagating through the signal lines are sufficiently attenuated in the 2.4 GHz band.

Figure 9:
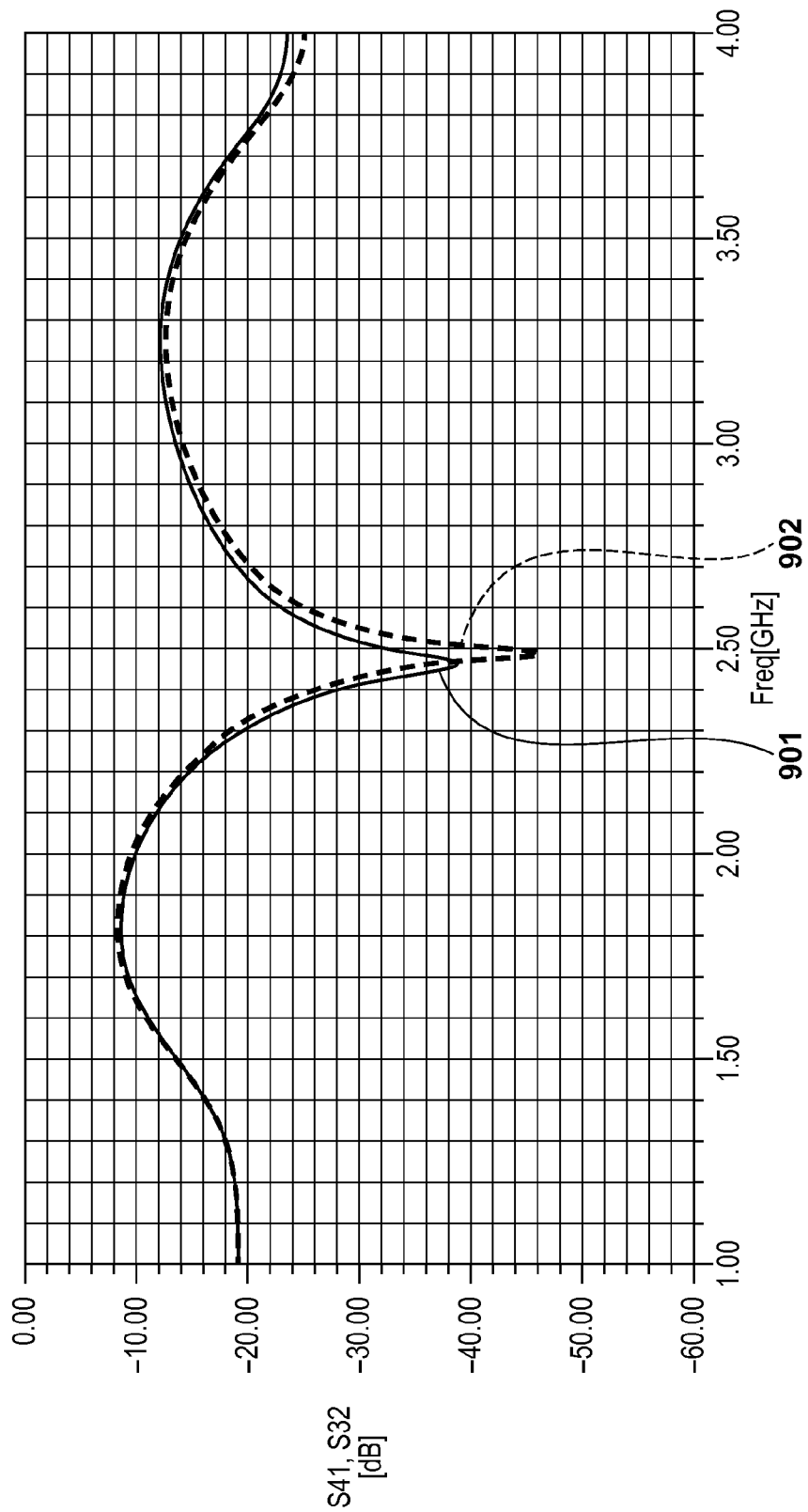
FIG. 9 is a graph showing the transmission coefficients of electromagnetic waves transmitted through adjacent signal lines in the circuit in FIGS. 7A to 7C.

FIG. 9 shows analysis results on a transmission coefficient S41 of electromagnetic waves propagating between port 1 of the signal line 701 and port 4 of the signal line 702 and a transmission coefficient S32 of electromagnetic waves propagating between port 2 of the signal line 701 and port 3 of the signal line 702. Referring to FIG. 9, a solid curve denoted by reference numeral 901 indicates the analysis result on S41, and a broken curve denoted by reference numeral 902 indicates the analysis result on S32. It is obvious from FIG. 9 that in the arrangement in FIGS. 7A to 7C, since both S41 and S32 indicate about −40 dB in the 2.4 GHz band, almost no electromagnetic waves propagate to the adjacent signal lines.

Although the arrangement in FIGS. 4A to 4C is constituted by four layers, the arrangement in FIGS. 7A to 7C has the conductors 706 and 707 formed on the same layer on which the ground conductor 703 is formed, and hence can be constituted by three layers. Therefore, when using a four-layer printed substrate, the arrangement in FIGS. 7A to 7C can reduce the mounting area by one layer as compared with the arrangement in FIGS. 4A to 4C. In addition, although the arrangement in FIGS. 4A to 4C requires the conductor vias 410 and 411 through which the conductor on the third layer is connected to the ground conductor, the arrangement in FIGS. 7A to 7C does not require them. This can reduce the cost.

Note that the EBG structures in FIGS. 4A to 4C and FIGS. 7A to 7C each are arranged to protrude from the two signal lines in the X-axis direction. However, on many general electronic circuit substrates, the number of signal lines is not limited to two, and three or more signal lines are arranged side by side. For this reason, when considering an EBG structure applied to a plurality of signal lines, the EBG structures in FIGS. 4A to 4C and FIGS. 7A to 7C each can be arranged without decreasing the mounting area of a substrate. Furthermore, in the arrangements in FIGS. 4A to 4C and FIGS. 7A to 7C, the conductors 406 and 407 or the conductors 706 and 707 are formed in a meander shape. However, the shape of each conductor is not limited to a meander shape, and it is possible to ensure the wire length of each conductor with, for example, a spiral shape, and downsize the arrangement.

In addition, in the arrangements in FIGS. 4A to 4C and FIGS. 7A to 7C, the conductors 404 and 405 or the conductors 704 and 705 each are arranged to entirely overlap any of the signal lines 401 and 402 or the signal lines 701 and 702 when viewed from the direction perpendicular to the substrate surface. However, this is not exhaustive. That is, the conductors 404 and 405 or the conductors 704 and 705 each may be arranged to only partially overlap any of the signal lines 401 and 402 or the signal lines 701 and 702 when viewed from the direction perpendicular to the substrate surface. In addition, in order to ensure a sufficient conductor length of each of the conductors 404 and 405 or the conductors 704 and 705, each of the conductors may be formed into a meander shape or spiral shape. In addition, although the signal lines 401 and 402 or the signal lines 701 and 702 are formed on the first layer (front surface) of the substrate in the arrangement in FIGS. 4A to 4C or FIGS. 7A to 7C, the signal lines may be arranged on an inner layer instead of the front or back surface of the substrate.

Third Embodiment

The first and second embodiments each have exemplified the electronic circuit having the EBG structure with one end being connected to the ground portion, and the other end being an open end. In contrast to this, an electronic circuit according to the third embodiment has a conductor between the first plane on which signal lines are arranged and the second plane on which a ground conductor parallel to the first plane is arranged, with one end of the conductor being connected to a signal line and the other end being an open end. This conductor structure prevents the propagation of an electromagnetic wave having an electrical length λ when the conductor length of the conductor arranged between the first and second planes is λ/4.

Figure 10A:
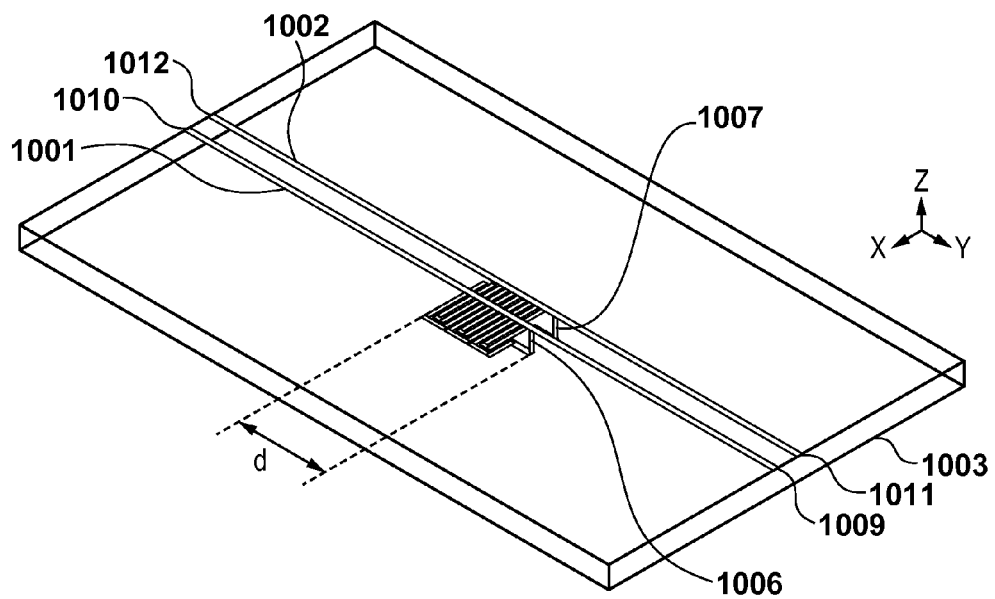
FIGS. 10A to 10C are schematic views, enlarged sectional view, and enlarged plan view, respectively, of an electronic circuit according to the third embodiment.
Figure 10B:
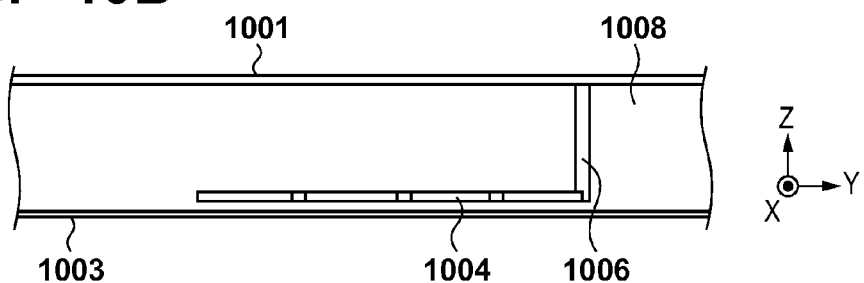
Figure 10C:
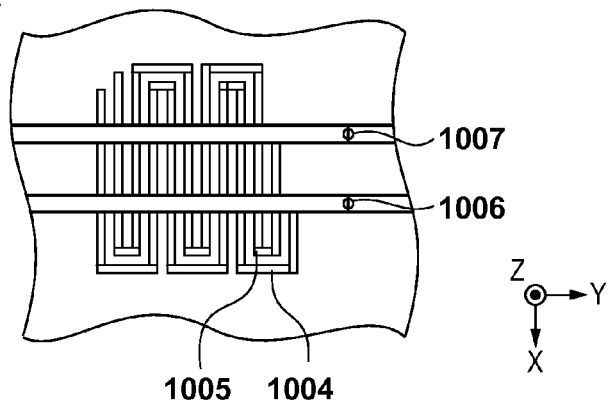

FIGS. 10A to 10C are schematic views showing the arrangement of an electronic circuit including an EBG structure according to this embodiment. FIG. 10A is a schematic view showing the overall arrangement of the electronic circuit. FIG. 10B is an enlarged sectional view of the EBG structure portion in FIG. 10A. FIG. 10C is an enlarged plan view of the EBG structure portion in FIG. 10A. The arrangement in FIGS. 10A to 10C exemplifies a case in which the conductors constituting the EBG are arranged to be nearer to the second layer on which the ground conductor is arranged than the first layer on which the signal lines are arranged.

As shown in FIGS. 10A to 10C, the electronic circuit according to this embodiment includes signal lines 1001 and 1002 each having a line shape, a ground conductor 1003, conductors 1004 and 1005 each having a line shape, conductor vias 1006 and 1007, and a dielectric 1008. More specifically, the signal lines 1001 and 1002 are arranged on the first layer of the printed substrate, the conductors 1004 and 1005 are arranged on the second layer, and the ground conductor 1003 is arranged on the third layer. The signal line 1001 and the conductor 1004 are connected to each other through the conductor via 1006, and the signal line 1002 and the conductor 1005 are connected to each other through the conductor via 1007.

Figure 11A:
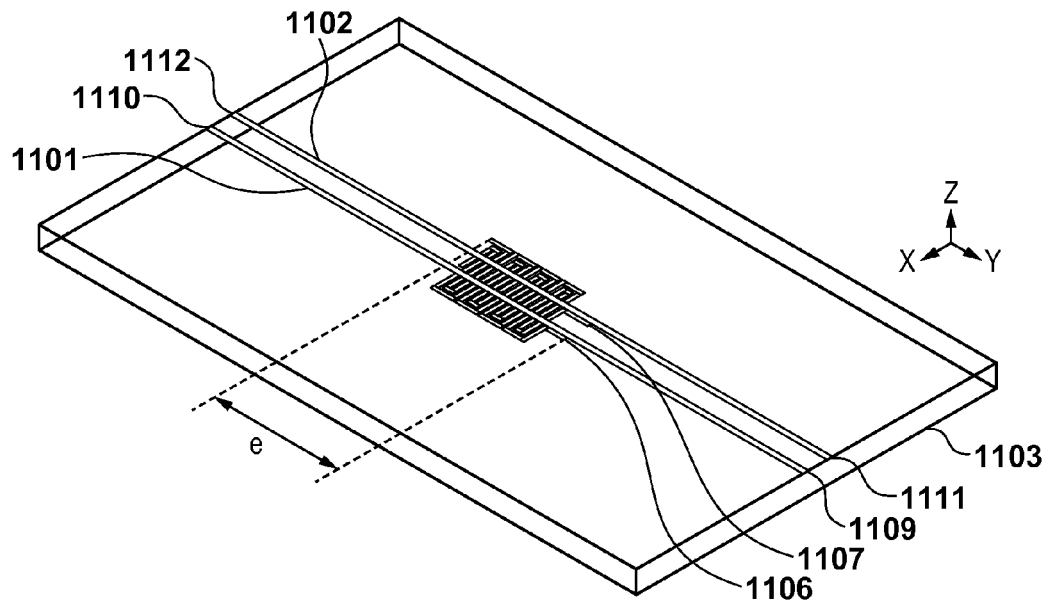
FIGS. 11A to 11C are schematic views, enlarged sectional view, and enlarged plan view of a circuit according to the third embodiment.
Figure 11B:
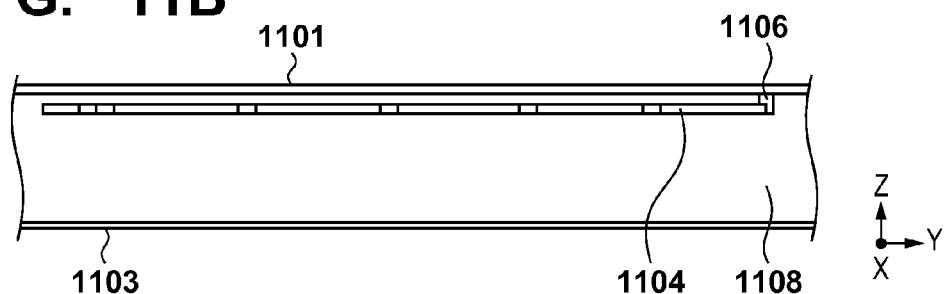
Figure 11C:
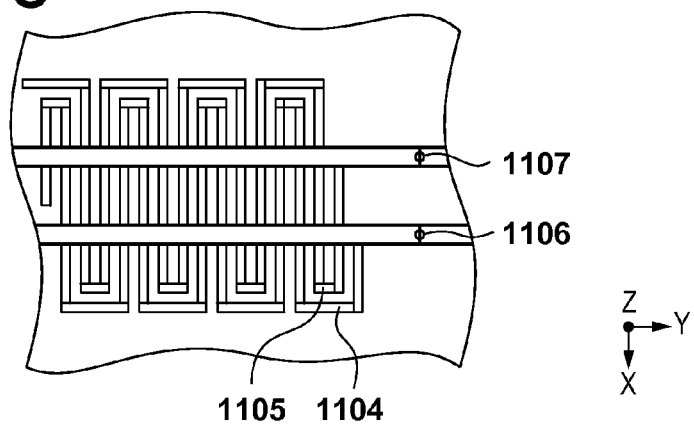

FIGS. 11A to 11C are schematic views showing the arrangement of an electronic circuit including an EBG structure similar to that in FIGS. 10A to 10C. FIG. 11A is a schematic view showing the overall arrangement of the electronic circuit. FIG. 11B is an enlarged sectional view of the EBG structure portion in FIG. 11A. FIG. 11C is an enlarged plan view of the EBG structure portion in FIG. 11A. The arrangement in FIGS. 11A to 11C exemplifies a case in which the conductors constituting the EBG are arranged to be nearer to the first layer on which the signal lines are arranged than the second layer on which the ground conductor is arranged.

The electronic circuit in FIGS. 11A to 11C includes signal lines 1101 and 1102 each having a line shape, a ground conductor 1103, conductors 1104 and 1105 each having a line shape, conductor vias 1106 and 1107, and a dielectric 1108. The signal lines 1101 and 1102 are arranged on the first layer of the printed substrate, the conductors 1104 and 1105 are arranged on the second layer, and the ground conductor 1103 is arranged on the third layer. The signal line 1101 and the conductor 1104 are connected to each other through the conductor via 1106, and the signal line 1102 and the conductor 1105 are connected to each other through the conductor via 1107. If the EBG structures shown in FIGS. 10A to 10C and FIGS. 11A to 11C are designed to cut off electromagnetic waves of 2.4 GHz to 2.5 GHz, lengths d and e of the EBG structures in the Y-axis direction are 4.15 mm and 2.95 mm, respectively.

The arrangements in FIGS. 10A to 10C and FIGS. 11A to 11C have, as the signal input and output terminals of the signal lines 1001 and 1101, terminal portions 1009 and 1109 in the positive Y-axis direction as ports 1 and terminal portions 1010 and 1110 in the negative Y-axis direction as ports 2. These arrangements also have, as the signal input and output terminals of the signal lines 1002 and 1102, terminal portions 1011 and 1111 in the positive Y-axis direction as ports 3 and terminal portions 1012 and 1112 in the negative Y-axis direction as ports 4. In this case, each of FIGS. 12 and 13 shows analysis results on a transmission coefficient S21 of electromagnetic waves propagating between ports 1 and 2 in the Y-axis direction and a transmission coefficient S43 of electromagnetic waves propagating between ports 3 and 4 in the Y-axis direction in each of the arrangements FIGS. 10A to 10C and FIGS. 11A to 11C.

Figure 12:
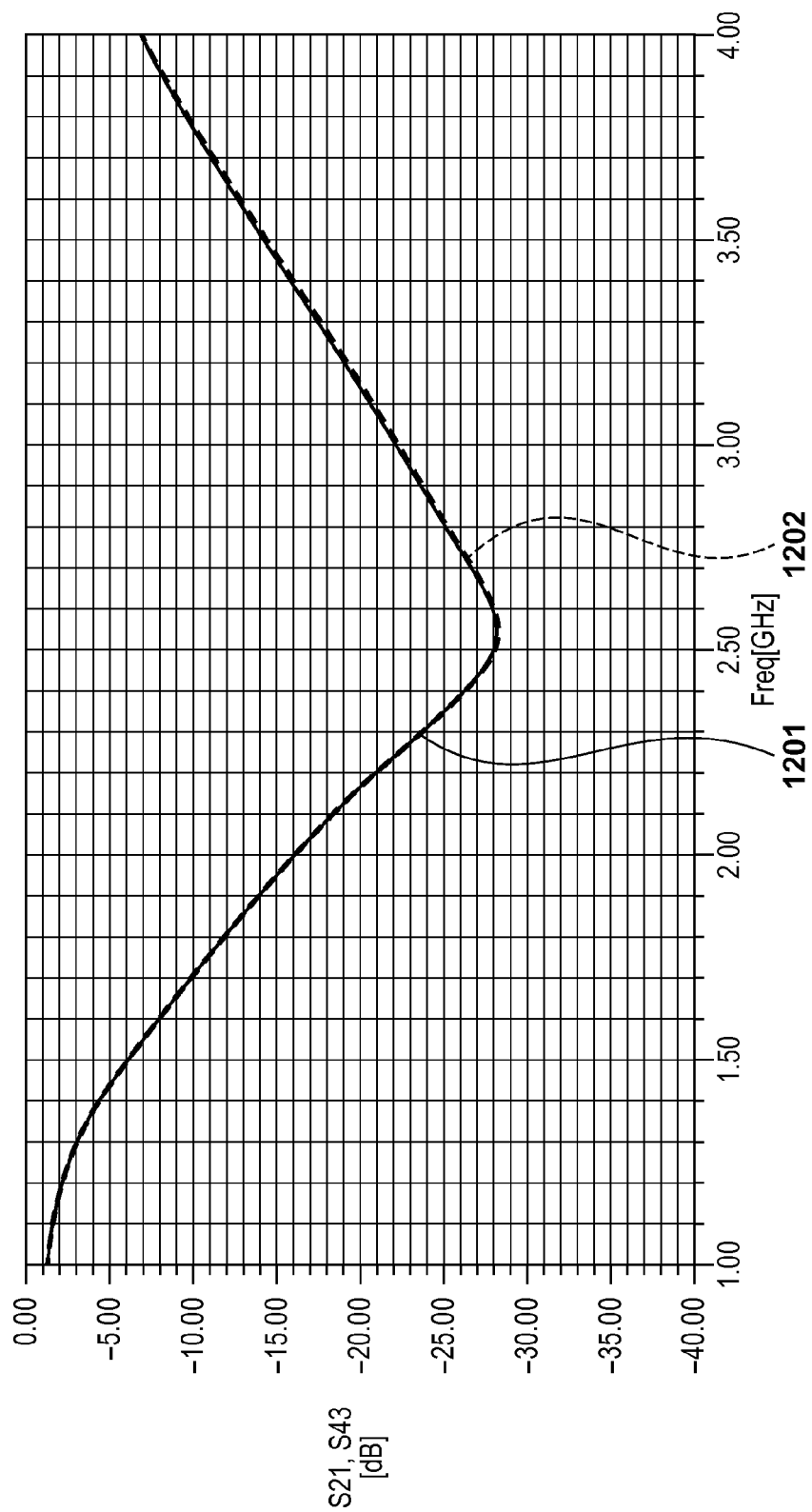
FIG. 12 is a graph showing the transmission coefficients of electromagnetic waves transmitted through signal lines in the circuit in FIGS. 10A to 10C.

Referring to FIG. 12, a solid curve denoted by reference numeral 1201 indicates the analysis result on S21 concerning the electronic circuit in FIGS. 10A to 10C, and a broken curve denoted by reference numeral 1202 indicates the analysis result on S43 concerning the electronic circuit in FIGS. 10A to 10C. Referring to FIG. 13, likewise, a solid curve denoted by reference numeral 1301 indicates the analysis result on S21 concerning the electronic circuit in FIGS. 11A to 11C, and a broken curve denoted by reference numeral 1302 indicates the analysis result on S43 concerning the electronic circuit in FIGS. 11A to 11C. It is obvious from FIG. 12 that in the arrangement in FIGS. 10A to 10C, since both the transmission coefficients S21 and S43 indicate about −27 dB in the 2.4 GHz band, electromagnetic waves propagating through the signal lines are sufficiently attenuated in the 2.4 GHz band. It is also obvious from FIG. 13 that in the arrangement in FIGS. 11A to 11C, since both the transmission coefficients S21 and S43 indicate about −20 dB in the 2.4 GHz band, electromagnetic waves propagating through the signal lines are sufficiently attenuated in the 2.4 GHz band.

Figure 13:
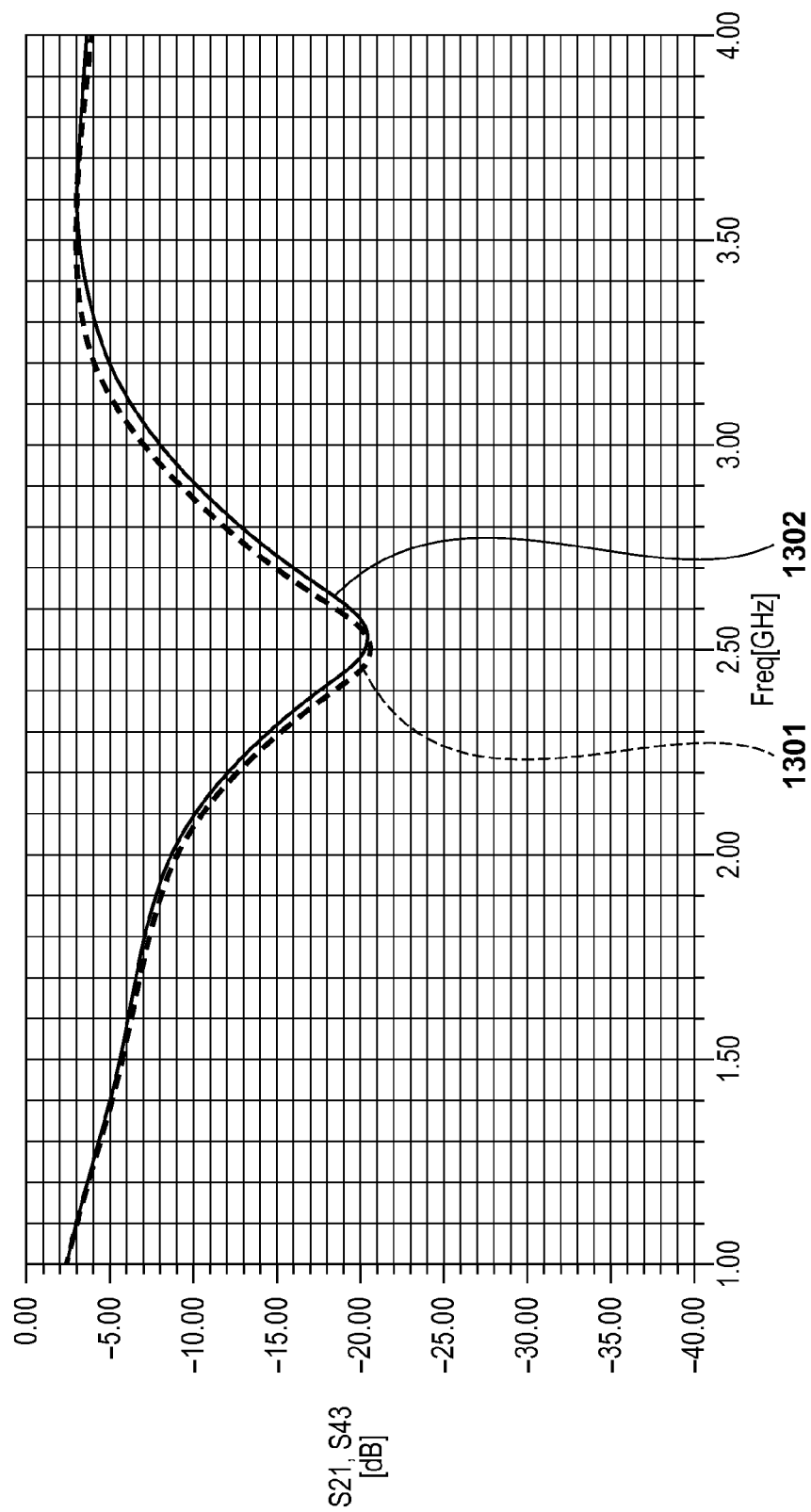
FIG. 13 is a graph showing the transmission coefficients of electromagnetic waves transmitted through signal lines in the circuit in FIGS. 11A to 11C.

When comparing the results in FIG. 12 with the results in FIG. 13, the transmission coefficients S21 and S43 in FIG. 12 are larger in attenuation amount. That is, the propagation of electromagnetic waves can be suppressed more. This is because the open end on which electric fields concentrate is arranged on the layer distant from the signal lines, and larger coupling with the ground conductor can be obtained in the arrangement in FIGS. 10A to 10C as compared with the arrangement in FIGS. 11A to 11C.

Figure 14:
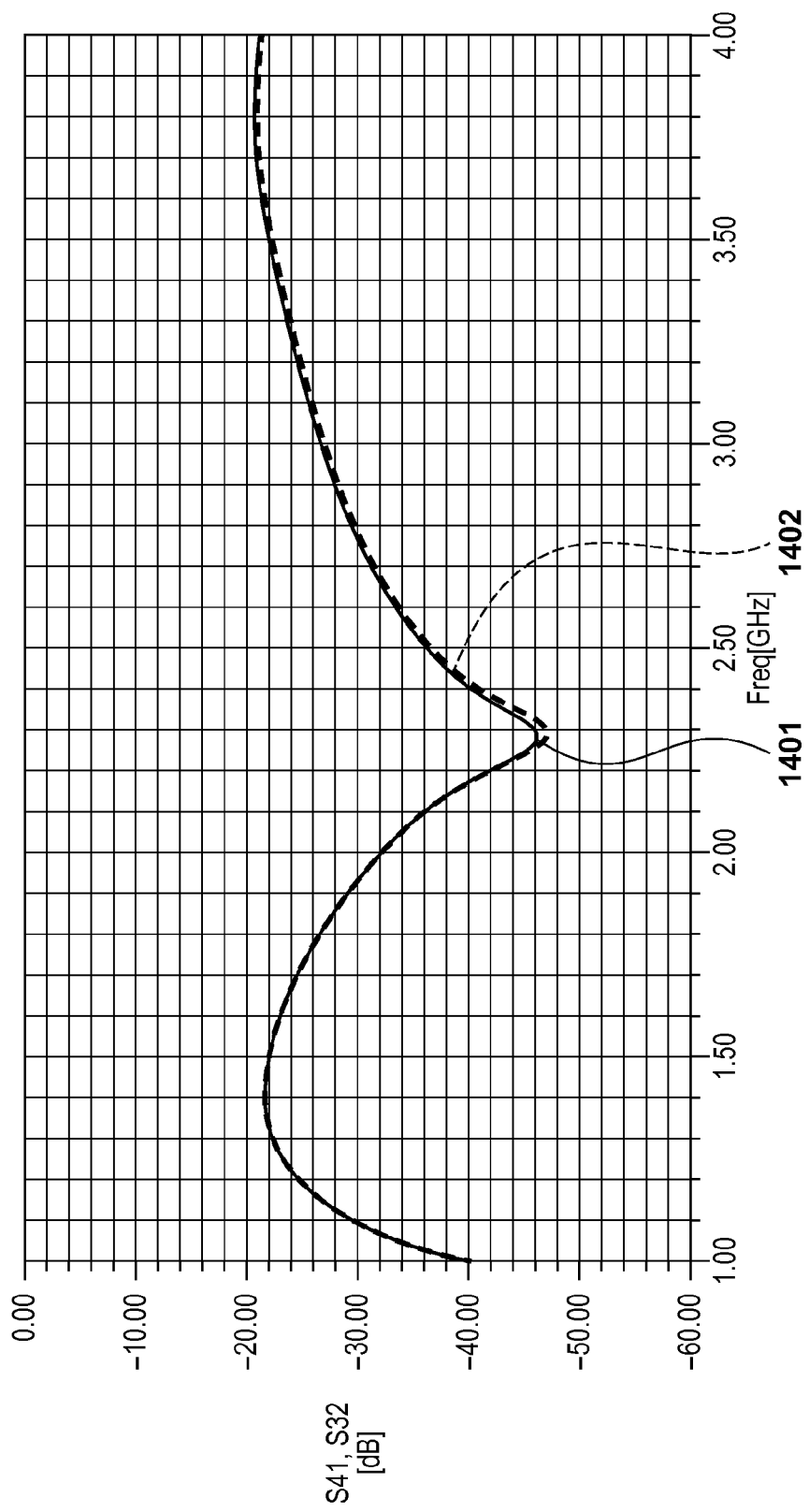
FIG. 14 is a graph showing the transmission coefficients of electromagnetic waves transmitted through adjacent signal lines in the circuit in FIGS. 10A to 10C.
Figure 15:
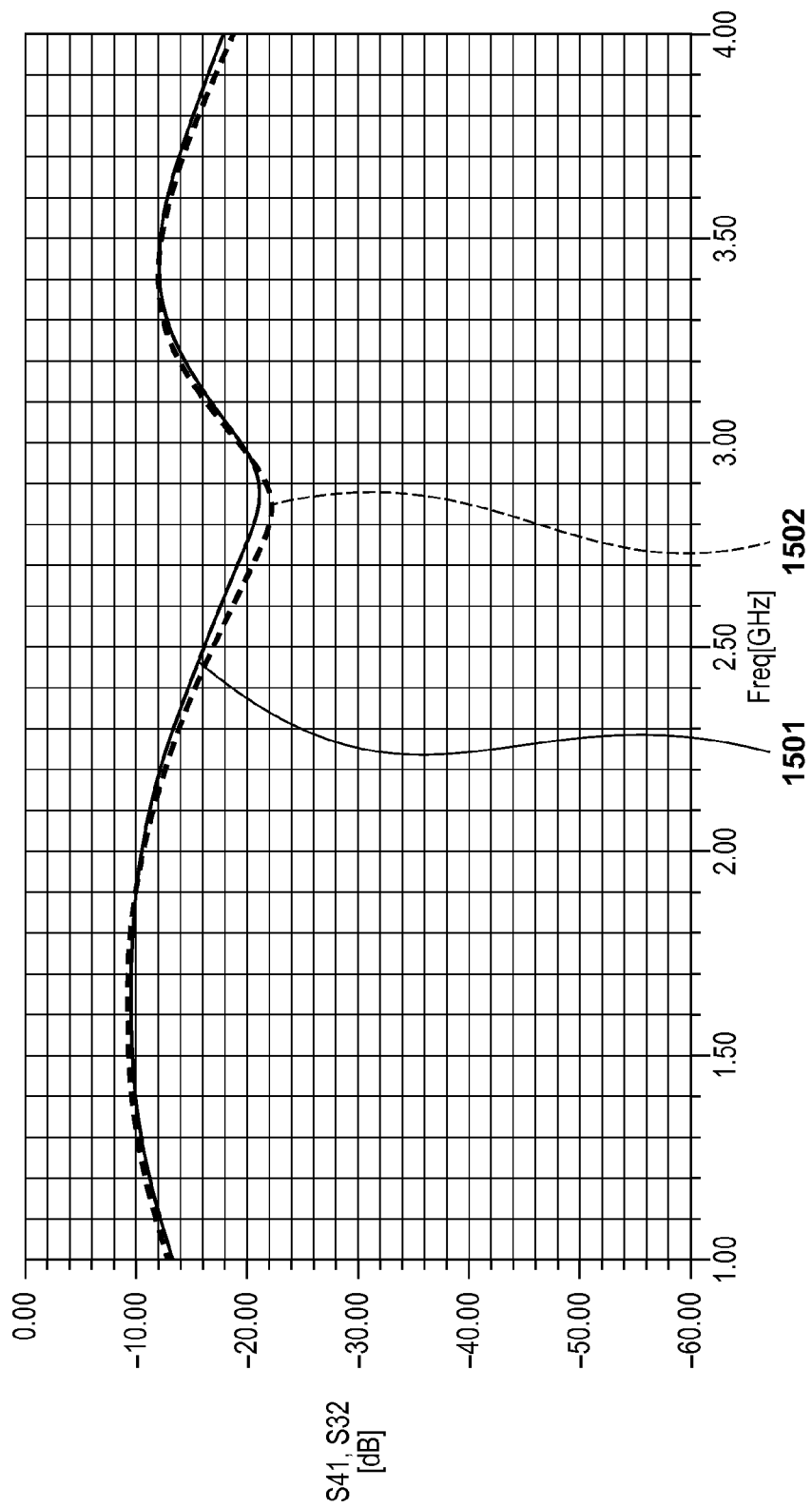
FIG. 15 is a graph showing the transmission coefficients of electromagnetic waves transmitted through adjacent signal lines in the circuit in FIGS. 11A to 11C.

FIGS. 14 and 15 respectively show analysis results on a transmission coefficient S41 of electromagnetic waves propagating between ports 1 and 4 and a transmission coefficient S32 of electromagnetic waves propagating between ports 2 and 3 in each of the arrangements in FIGS. 10A to 10C and FIGS. 11A to 11C. Referring to FIG. 14, a solid curve denoted by reference numeral 1401 indicates the analysis result on S41 concerning the electronic recruit in FIGS. 10A to 10C, and a broken curve denoted by reference numeral 1402 indicates the analysis result on S32 concerning the electronic circuit in FIGS. 10A to 10C. Likewise, referring to FIG. 15, a solid curve denoted by reference numeral 1501 indicates the analysis result on S41 concerning the electronic recruit in FIGS. 11A to 11C, and a broken curve denoted by reference numeral 1502 indicates the analysis result on S32 concerning the electronic circuit in FIGS. 11A to 11C.

It is obvious from FIG. 14 that in the arrangement in FIGS. 10A to 10C, since both S41 and S32 indicate about −30 dB in the 2.4 GHz band, almost no electromagnetic waves propagate to the adjacent signal lines. On the other hand, it is obvious from FIG. 15 that in the arrangement in FIGS. 11A to 11C, since both S41 and S32 indicate about −15 dB in the 2.4 GHz band. It is therefore obvious that when comparing the arrangement in FIGS. 10A to 10C with the arrangement in FIGS. 11A to 11C, no electromagnetic waves propagate to adjacent signal lines in the arrangement in FIGS. 10A to 10C. This is because the open end on which electric fields concentrate is arranged on the layer distant from the signal lines, and coupling between adjacent signal lines decreases as compared with the arrangement in FIGS. 11A to 11C.

As shown in FIGS. 10A to 10C, therefore, it is possible to implement a compact electron circuit arrangement which prevents the propagation of electromagnetic waves to adjacent signal lines by separating the position of the open end from the signal lines in an electronic circuit having an EBG structure with one end being connected to a signal line and the other end being an open end as shown in FIGS. 10A to 10C. Note that in the EBG structure portion in FIGS. 10A to 10C, all the conductors 1004 and 1005 are arranged on the layer distant from the layer on which the signal lines are formed. However, this is not exhaustive. That is, it is possible to obtain similar effects by arranging the open ends of the conductors 1004 and 1005 on a layer distant from the layer on which the signal lines are formed even if other conductor portions are arranged on a layer near the layer on which the signal lines are arranged.

Note that the EBG structure in FIGS. 10A to 10C is arranged to protrude from the two signal lines in the X-axis direction. However, on many general electronic circuit substrates, the number of signal lines is not limited to two, and three or more signal lines are arranged side by side. For this reason, when considering an EBG structure applied to a plurality of signal lines, the EBG structure in FIGS. 10A to 10C can be arranged without decreasing the mounting area of a substrate. In addition, in the EBG structure in FIGS. 10A to 10C, the conductors 1004 and 1005 are arranged to overlap both the signal lines 1001 and 1002. However, they may be arranged to overlap only one signal line. Furthermore, in the EBG structure in FIGS. 10A to 10C, the conductors 1004 and 1005 are formed in a meander shape. However, the shape of each conductor is not limited to a meander shape and may be, for example, a line shape or spiral shape.

Fourth Embodiment

The first to third embodiments each have exemplified the arrangement having the conductor between the plane on which the signal lines are arranged and the plane on which the ground conductor is arranged, with one end of the conductor being connected to the ground conductor or the signal line, and the other end being an open end. In contrast to this, unlike the first to third embodiments, an electronic circuit according to the fourth embodiment has a conductor between the first plane on which signal lines are arranged and the second plane on which a ground conductor parallel to the first plane is arranged, with the two ends of the conductor being open ends. This conductor structure prevents the propagation of an electromagnetic wave having an electrical length $\lambda$ when the conductor length of the conductor whose two ends are open ends is $\lambda/2$.

Figure 16A:
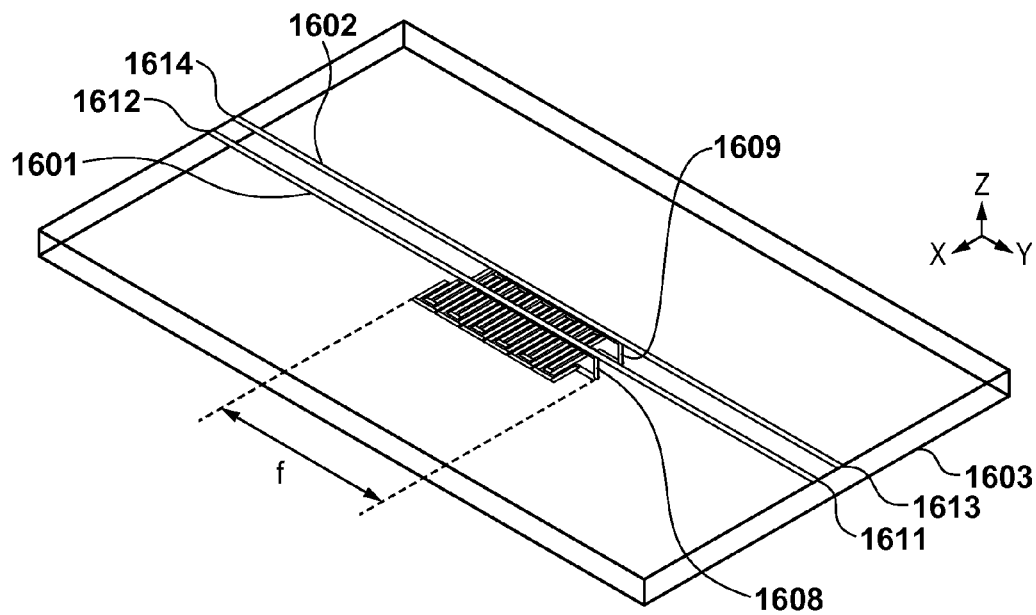
FIGS. 16A to 16C are schematic views, enlarged sectional view, and enlarged plan view, respectively, of an electronic circuit according to the fourth embodiment.
Figure 16B:
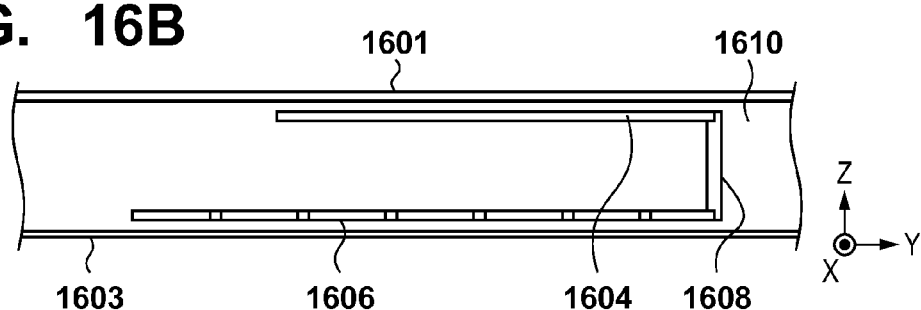
Figure 16C:
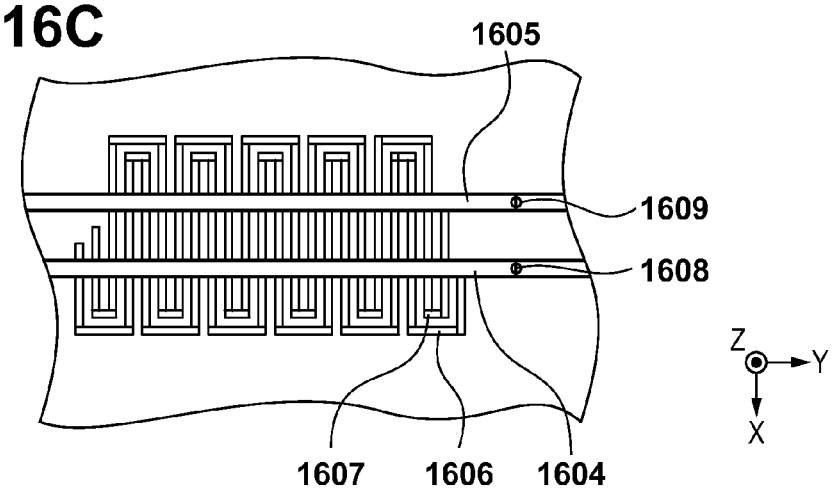

FIGS. 16A to 16C are schematic views showing the arrangement of an electronic circuit including an EBG structure according to this embodiment. FIG. 16A is a schematic view showing the overall arrangement of the electronic circuit. FIG. 16B is an enlarged sectional view of the EBG structure portion in FIG. 16A. FIG. 16C is an enlarged plan view of the EBG structure portion in FIG. 16A.

As shown in FIGS. 16A to 16C, the electronic circuit according to this embodiment includes signal lines 1601 and 1602 each having a line shape, a ground conductor 1603, conductors 1604 to 1607 each having a line shape, conductor vias 1608 and 1609, and a dielectric 1610. More specifically, the signal lines 1601 and 1602 are arranged on the first layer of the printed substrate, the conductors 1604 and 1605 are arranged on the second layer, the conductors 1606 and 1607 are arranged on the third layer, and the ground conductor 1603 is arranged on the fourth layer. The conductors 1604 and 1606 are connected to each other through the conductor via 1608, and the conductors 1605 and 1607 are connected to each other through the conductor via 1609.

As compared with the arrangement in FIGS. 4A to 4C, the arrangement in FIGS. 16A to 16C makes it unnecessary to arrange conductors corresponding to the conductor vias 410 and 411 because the two ends of the EBG structure portion (the conductors 1604 to 1607 and the conductor vias 1608 and 1609) are open ends, and hence can achieve a reduction in cost. In addition, if the arrangement in FIGS. 4A to 4C uses through vias as the conductor vias 410 and 411, the via land reduces the mounting areas of the uppermost and lowermost layer portions of the substrate. However, as in this embodiment, an arrangement whose two ends are open ends does not reduce the mounting areas of the uppermost and lowermost layer portions of the substrate. For this reason, as compared with the arrangement in FIGS. 4A to 4C, it is possible to obtain larger mounting areas on the uppermost and lowermost layer portions. Note that if the EBG structure shown in FIGS. 16A to 16C is designed to cut off electromagnetic waves of 2.4 GHz to 2.5 GHz, a length f of the EBG structure in the Y-axis direction is 5.3 mm.

Figure 17:
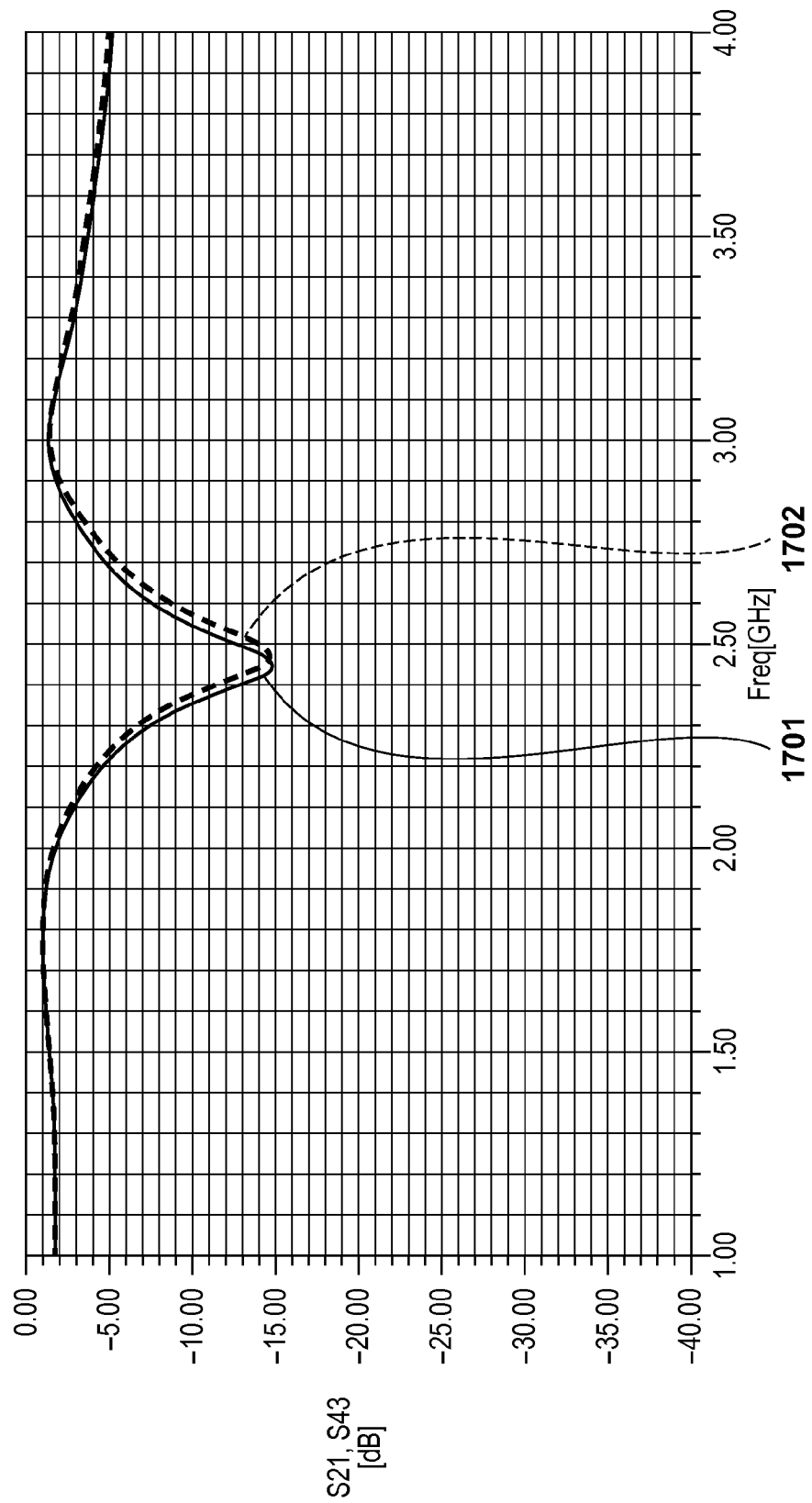
FIG. 17 is a graph showing the transmission coefficients of electromagnetic waves transmitted through signal lines in the circuit in FIGS. 16A to 16C.

The arrangement in FIGS. 16A to 16C has, as the signal input and output terminals of the signal line 1601, a terminal portion 1611 in the positive Y-axis direction as port 1 and a terminal portion 1612 in the negative Y-axis direction as port 2. This arrangement also has, as the signal input and output terminals of the signal line 1602, a terminal portion 1613 in the positive Y-axis direction as port 3 and a terminal portion 1614 in the negative Y-axis direction as port 4. In this case, FIG. 17 shows analysis results on a transmission coefficient S21 of electromagnetic waves propagating between ports 1 and 2 in the Y-axis direction and a transmission coefficient S43 of electromagnetic waves propagating between ports 3 and 4 in the Y-axis direction. Referring to FIG. 17, a solid curve denoted by reference numeral 1701 indicates the analysis result on S21, and a broken curve denoted by reference numeral 1702 indicates the analysis result on S43. It is obvious from FIG. 17 that in the arrangement in FIGS. 16A to 16C, since both the transmission coefficients S21 and S43 indicate about −15 dB in the 2.4 GHz band, electromagnetic waves propagating through the signal lines are sufficiently attenuated in the 2.4 GHz band.

Figure 18:
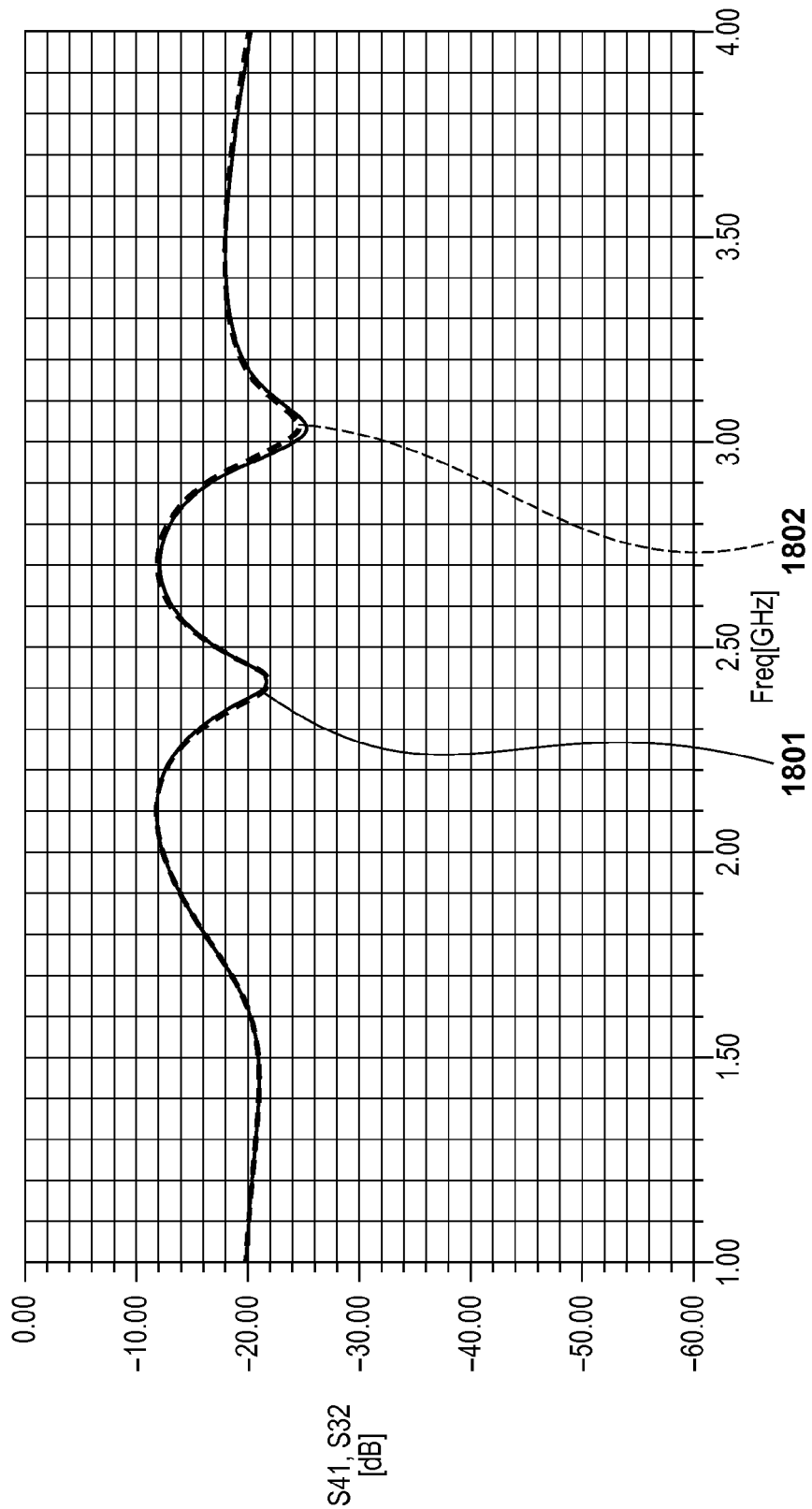
FIG. 18 is a graph showing the transmission coefficients of electromagnetic waves transmitted through adjacent signal lines in the circuit in FIGS. 16A to 16C.

FIG. 18 shows analysis results on a transmission coefficient S41 of electromagnetic waves propagating between port 1 of the signal line 1601 and port 4 of the signal line 1602 and a transmission coefficient S32 of electromagnetic waves propagating between port 2 of the signal line 1601 and port 3 of the signal line 1602. Referring to FIG. 18, a solid curve denoted by reference numeral 1801 indicates the analysis result on S41, and a broken curve denoted by reference numeral 1802 indicates the analysis result on S32. It is obvious from FIG. 18 that in the arrangement in FIGS. 16A to 16C, since both S41 and S32 indicate about −20 dB in the 2.4 GHz band, almost no electromagnetic waves propagate to the adjacent signal lines.

Note that the EBG structure in FIGS. 16A to 16C is arranged to protrude from the two signal lines in the X-axis direction. However, on many general electronic circuit substrates, the number of signal lines is not limited to two, and three or more signal lines are arranged side by side. For this reason, when considering an EBG structure applied to a plurality of signal lines, the EBG structure in FIGS. 16A to 16C can be arranged without decreasing the mounting area of a substrate.

In addition, in the EBG structure in FIGS. 16A to 16C, the conductors 1606 and 1607 are arranged to overlap both the signal lines 1601 and 1602. However, they may be arranged to overlap only one signal line. Furthermore, in the arrangement in FIGS. 16A to 16C, the conductors 1606 and 1607 are formed in a meander shape. However, the shape of each conductor is not limited to a meander shape and may be a shape such as a line shape or spiral shape. In the arrangement in FIGS. 16A to 16C, the conductors 1604 and 1605 are arranged to entirely overlap the signal lines 1601 and 1602, respectively. However, only part of each conductor may overlap a corresponding one of the signal lines. In addition, in order to ensure a sufficient conductor length of each of the conductors 1604 and 1605, each of the conductors 1604 and 1605 may be formed into a shape such as a meander shape or spiral shape in the arrangement in FIGS. 16A to 16C. In addition, although the signal lines 1601 and 1602 are formed on the first layer (front surface) of the substrate in the arrangement in FIGS. 16A to 16C, the signal lines may be arranged on an inner layer instead of the front or back surface of the substrate.

Fifth Embodiment

The first to fourth embodiments each have exemplified the arrangement having the conductor between the plane on which the signal lines are arranged and the plane on which the ground conductor is arranged, with one of the end portions or the two end portions being open ends. In contrast to this, an electronic circuit according to the fifth embodiment has a conductor between the first plane on which signal lines are arranged and the second plane on which a ground conductor parallel to the first plane is arranged, with the two end portions of the conductor being connected to the ground conductor. According to such a conductor structure, when the conductor length of the conductor is λ/2, the propagation of electromagnetic waves with an electrical length λ is prevented.

Figure 19A:
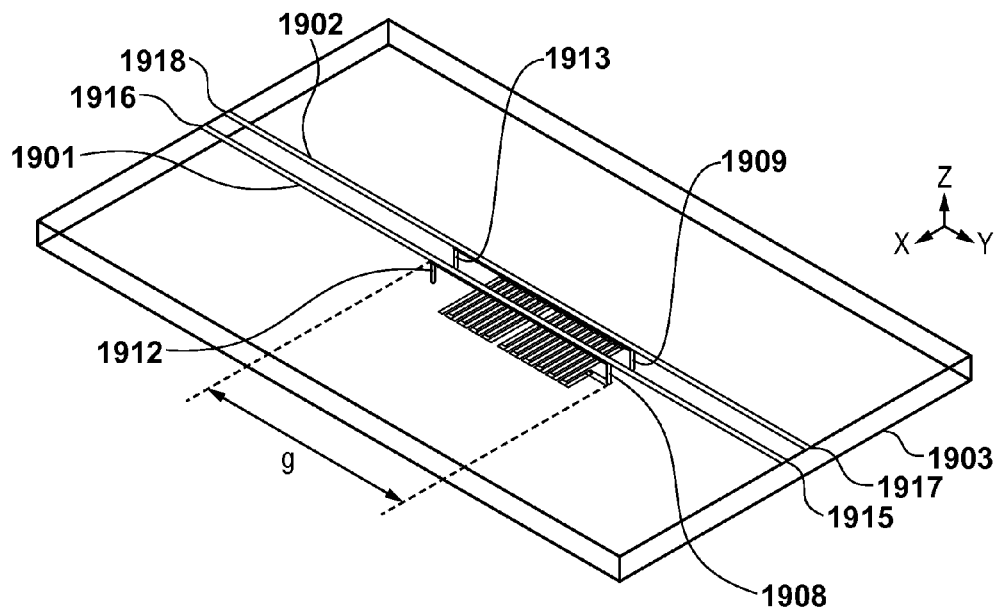
FIGS. 19A to 19C are schematic views, enlarged sectional view, and enlarged plan view, respectively, of an electronic circuit according to the fifth embodiment.
Figure 19B:
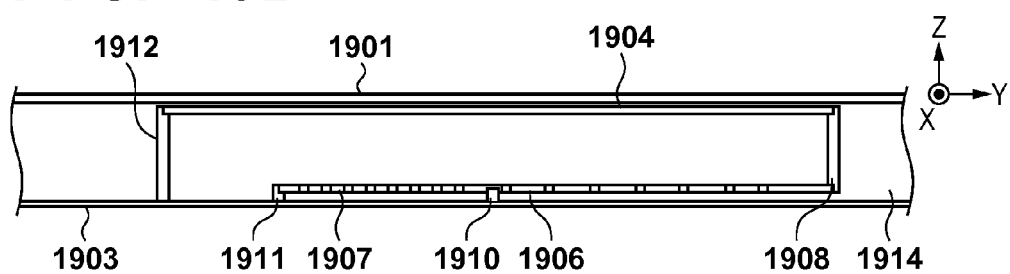
Figure 19C:
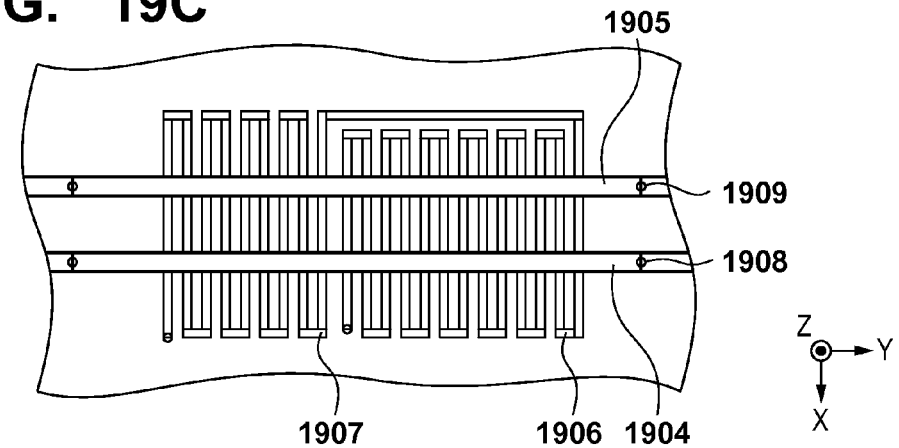

FIGS. 19A to 19C are schematic views showing the arrangement of an electronic circuit including an EBG structure according to this embodiment. FIG. 19A is a schematic view showing the overall arrangement of the electronic circuit. FIG. 19B is an enlarged sectional view of the EBG structure portion in FIG. 19A. FIG. 19C is an enlarged plan view of the EBG structure portion in FIG. 19A.

As shown in FIGS. 19A to 19C, the electronic circuit according to this embodiment includes signal lines 1901 and 1902 each having a line shape, a ground conductor 1903, conductors 1904 to 1907 each having a line shape, conductor vias 1908 to 1913, and a dielectric 1914. More specifically, the signal lines 1901 and 1902 are arranged on the first layer of the printed substrate, the conductors 1904 and 1905 are arranged on the second layer, the conductors 1906 and 1907 are arranged on the third layer, and the ground conductor 1903 is arranged on the fourth layer.

The ground conductor 1903 and the conductor 1906 are connected to each other through the conductor via 1910. The conductors 1906 and 1904 are connected to each other through the conductor via 1908. The conductor 1904 and the ground conductor 1903 are connected to each other through the conductor via 1912. In addition, the ground conductor 1903 and the conductor 1907 are connected to each other through the conductor via 1911. The conductors 1907 and 1905 are connected to each other through the conductor via 1909. The conductor 1905 and the ground conductor 1903 are connected to each other through the conductor via 1913. Note that if the EBG structure shown in FIGS. 19A to 19C is designed to cut off electromagnetic waves of 2.4 GHz to 2.5 GHz, a length g of the EBG structure in the Y-axis direction is 6.5 mm.

Figure 20A:
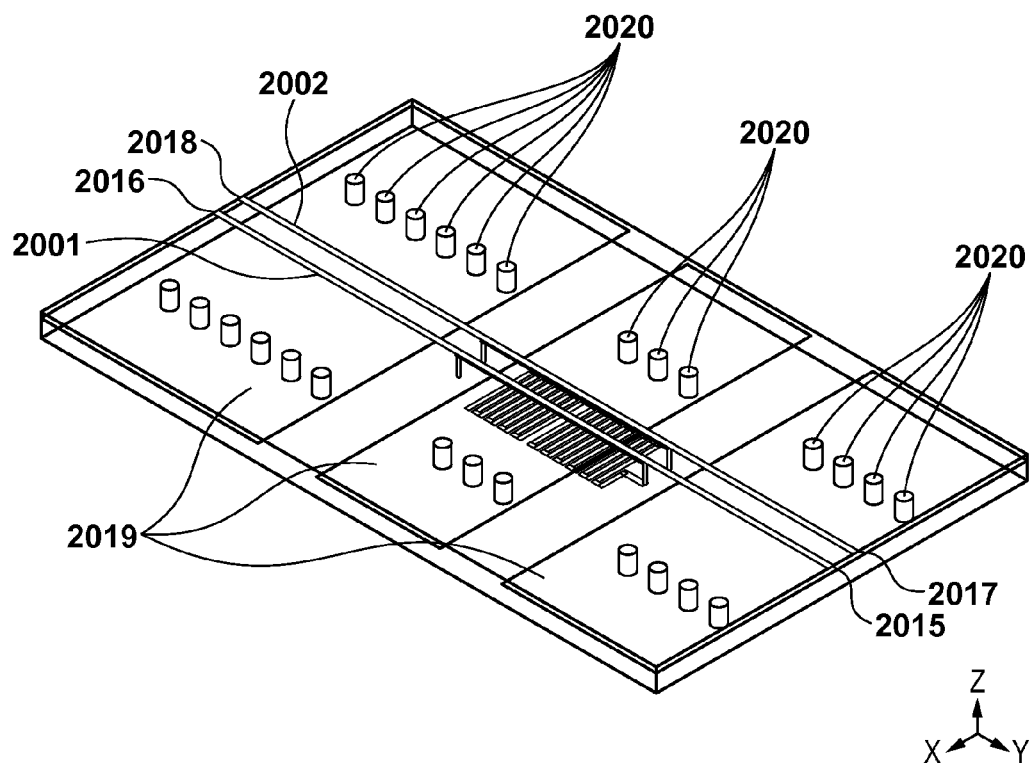
FIGS. 20A and 20B are schematic views and enlarged sectional view, respectively, of another electronic circuit according to the fifth embodiment.
Figure 20B:
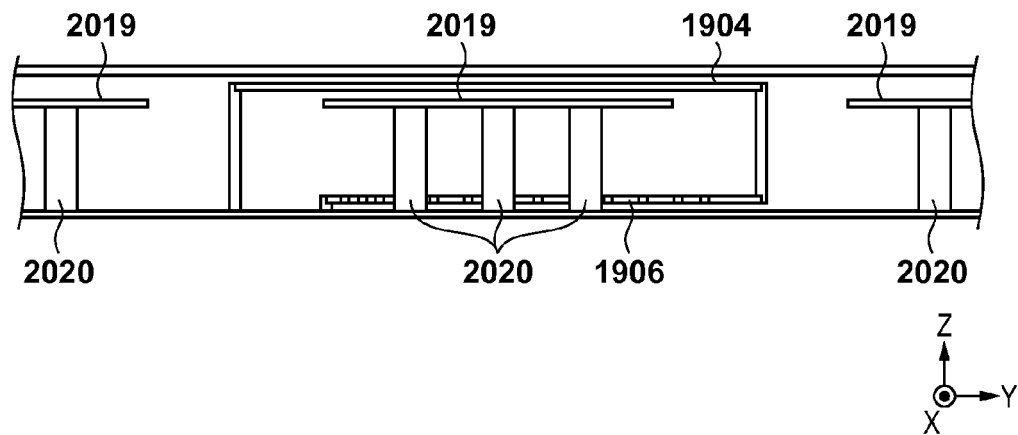

FIGS. 20A and 20B are schematic views showing the arrangement of an electronic circuit including another EBG structure according to this embodiment. The electronic circuit in FIGS. 20A and 20B includes an EBG structure similar to that in FIGS. 19A to 19C. FIG. 20A is a schematic view showing the overall arrangement of the electronic circuit. FIG. 20B is an enlarged sectional view of the EBG structure portion in FIG. 20A. The electronic circuit arrangement in FIGS. 20A and 20B has a conductor 2019 between the second and third layers of the printed substrate shown in FIGS. 19A to 19C, with the conductor 2019 and the ground conductor 1903 being connected to each other through many conductor vias 2020. A general electronic circuit substrate is constituted by a plurality of layers. When designing such a substrate, ground conductors are arranged on a plurality of layers and connected to each other through conductor vias to make the substrate noise resistant. In this case, as shown in FIGS. 20A and 20B, ground conductors may be arranged between the conductors 1904 and 1905 and between the conductors 1906 and 1907 of the EBG structure.

The arrangements in FIGS. 19A to 19C and FIGS. 20A and 20B have, as the signal input and output terminals of signal lines 1901 and 2001, terminal portions 1915 and 2015 in the positive Y-axis direction as ports 1 and terminal portions 1916 and 2016 in the negative Y-axis direction as ports 2. These arrangements also have, as the signal input and output terminals of the signal lines 1902 and 2002, terminal portions 1917 and 2017 in the positive Y-axis direction as ports 3 and terminal portions 1918 and 2018 in the negative Y-axis direction as ports 4. In this case, each of FIGS. 21 and 22 shows analysis results on a transmission coefficient S21 of electromagnetic waves propagating between ports 1 and 2 in the Y-axis direction and a transmission coefficient S43 of electromagnetic waves propagating between ports 3 and 4 in the Y-axis direction in each of the arrangements FIGS. 19A to 19C and FIGS. 20A and 20B.

Figure 21:
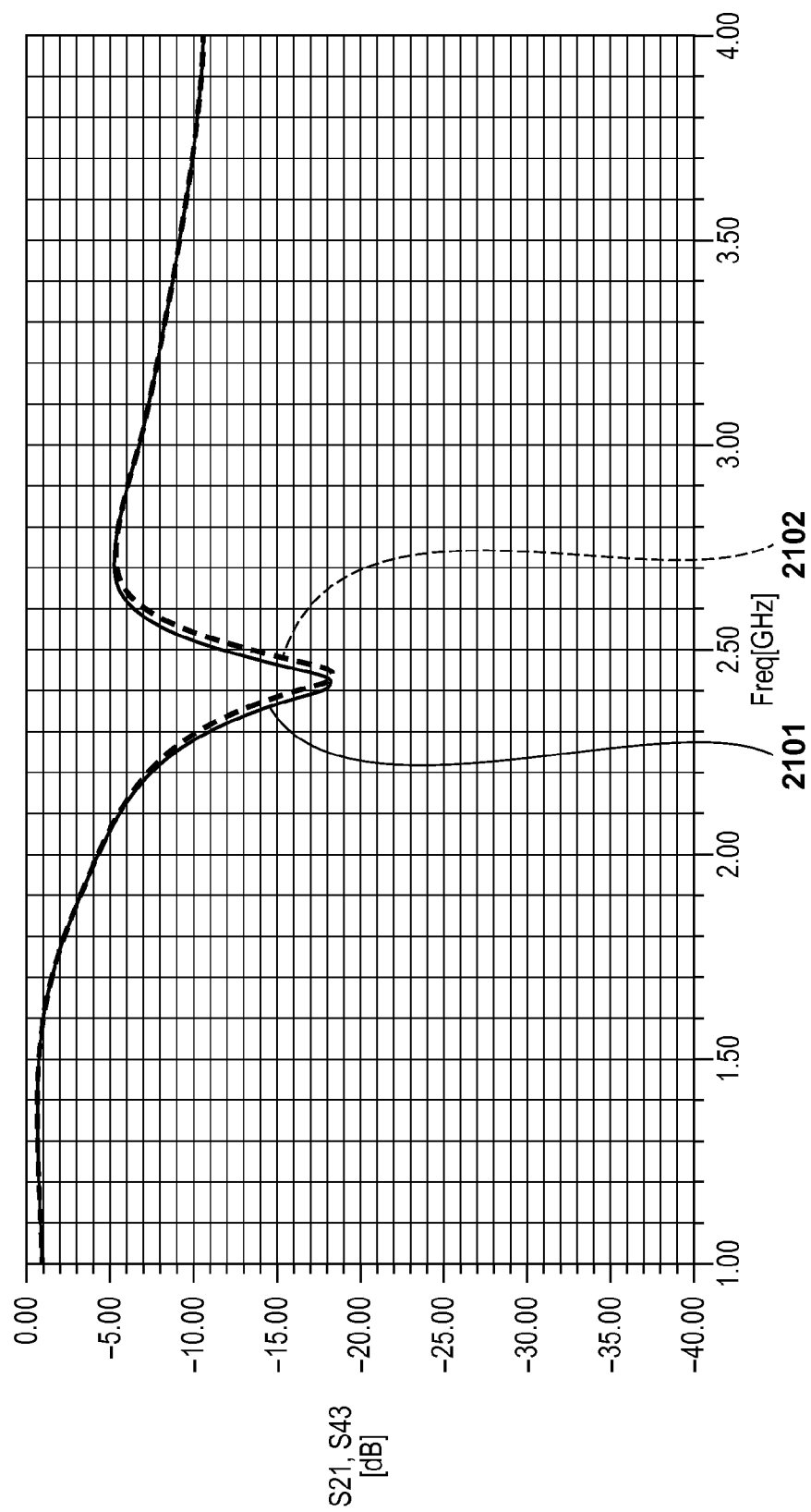
FIG. 21 is a graph showing the transmission coefficients of electromagnetic waves transmitted through signal lines in the circuit in FIGS. 19A to 19C.

Referring to FIG. 21, a solid curve denoted by reference numeral 2101 indicates the analysis result on S21 concerning the electronic circuit in FIGS. 19A to 19C, and a broken curve denoted by reference numeral 2102 indicates the analysis result on S43 concerning the electronic circuit in FIGS. 19A to 19C. Referring to FIG. 22, likewise, a solid curve denoted by reference numeral 2201 indicates the analysis result on S21 concerning the electronic circuit in FIGS. 20A and 20B, and a broken curve denoted by reference numeral 2202 indicates the analysis result on S43 concerning the electronic circuit in FIGS. 20A and 20B. It is obvious from FIG. 21 that in the arrangement in FIGS. 19A to 19C, since both the transmission coefficients S21 and S43 indicate about −17 dB in the 2.4 GHz band, electromagnetic waves propagating through the signal lines are sufficiently attenuated in the 2.4 GHz band. It is also obvious from FIG. 22 that in the arrangement in FIGS. 20A and 20B, since both the transmission coefficients S21 and S43 indicate about −8 dB in the 2.4 GHz band, electromagnetic waves propagating through the signal lines are attenuated in the 2.4 GHz band.

Figure 22:
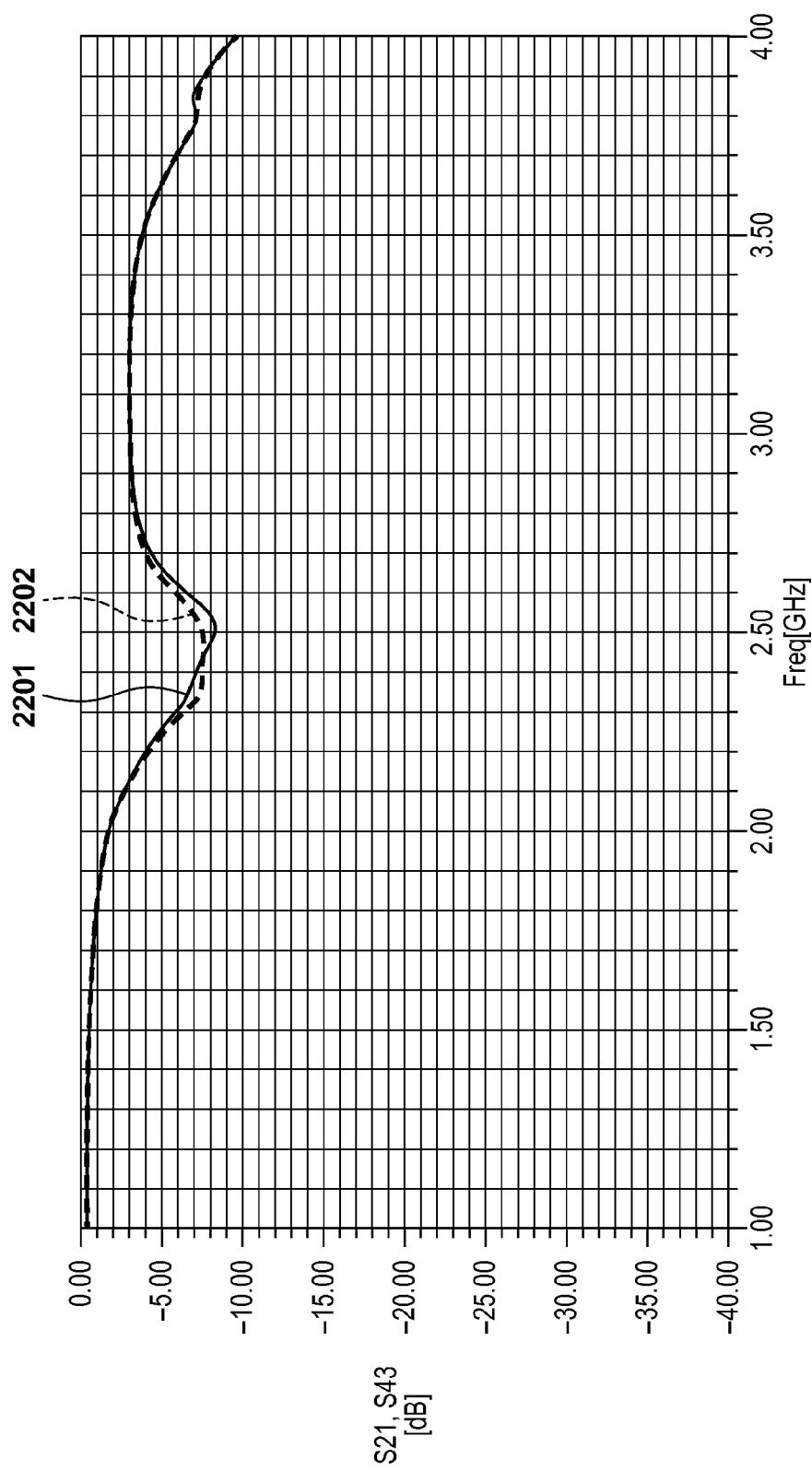
FIG. 22 is a graph showing the transmission coefficients of electromagnetic waves transmitted through signal lines in the circuit in FIGS. 20A and 20B.

The peak of the cutoff frequency of each of the transmission coefficients S21 and S43 in FIG. 21 is 2.43 GHz, and the peak of the cutoff frequency of each of the transmission coefficients S21 and S43 in FIG. 22 is 2.46 GHz. Obviously, there is almost no change in frequency. This indicates that the EBG structure shown in FIGS. 19A to 19C is resistant to the influence of a conductor arranged near the structure. That is, when designing the EBG structure in FIGS. 19A to 19C on an electronic circuit substrate, it is not necessary to give strict consideration to a conductor arrangement around the structure, because there is no change in cutoff frequency even if a conductor is arranged near the EBG structure.

Figure 23:
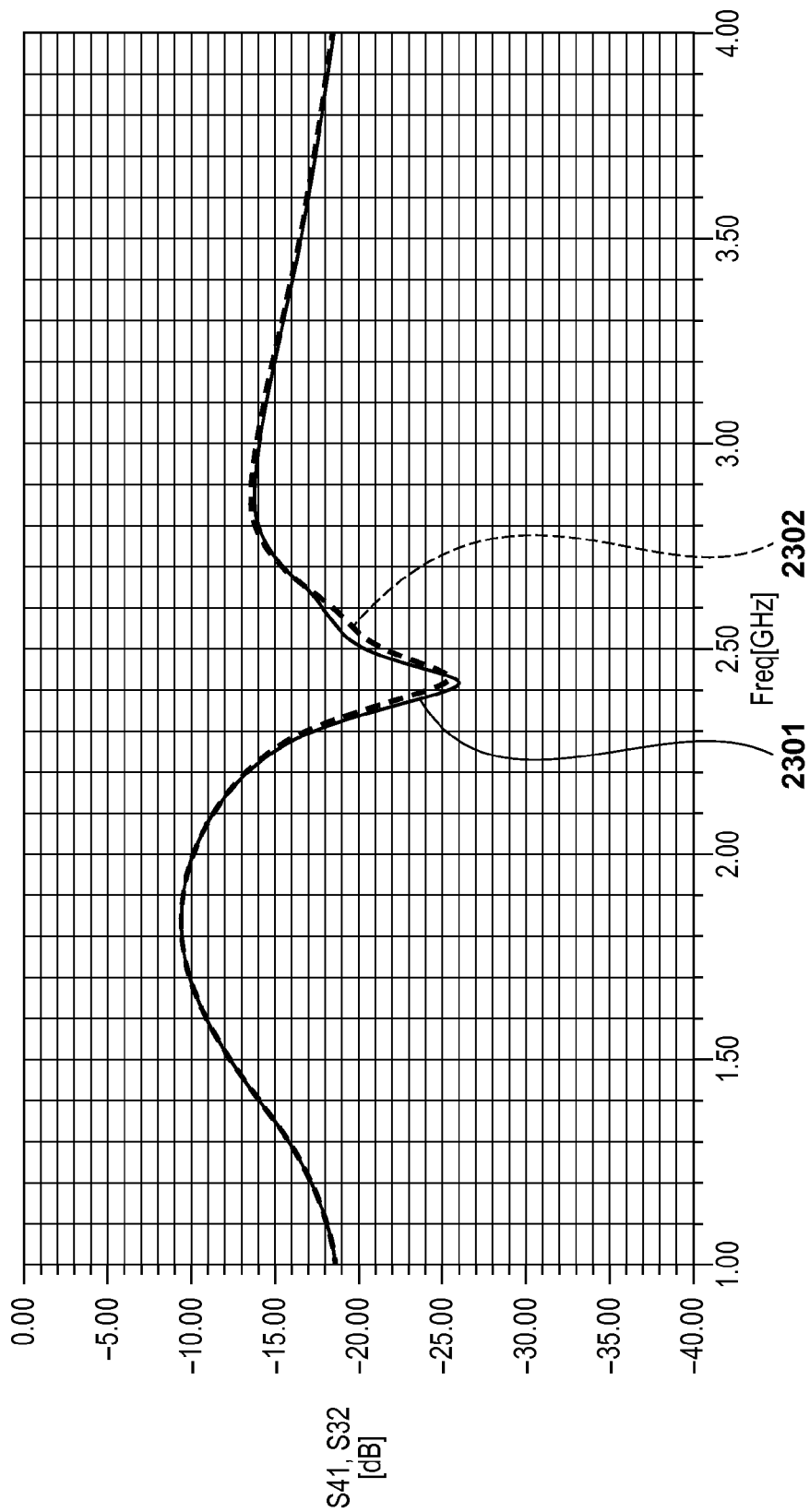
FIG. 23 is a graph showing the transmission coefficients of electromagnetic waves transmitted through adjacent signal lines in the circuit in FIGS. 19A to 19C.
Figure 24:
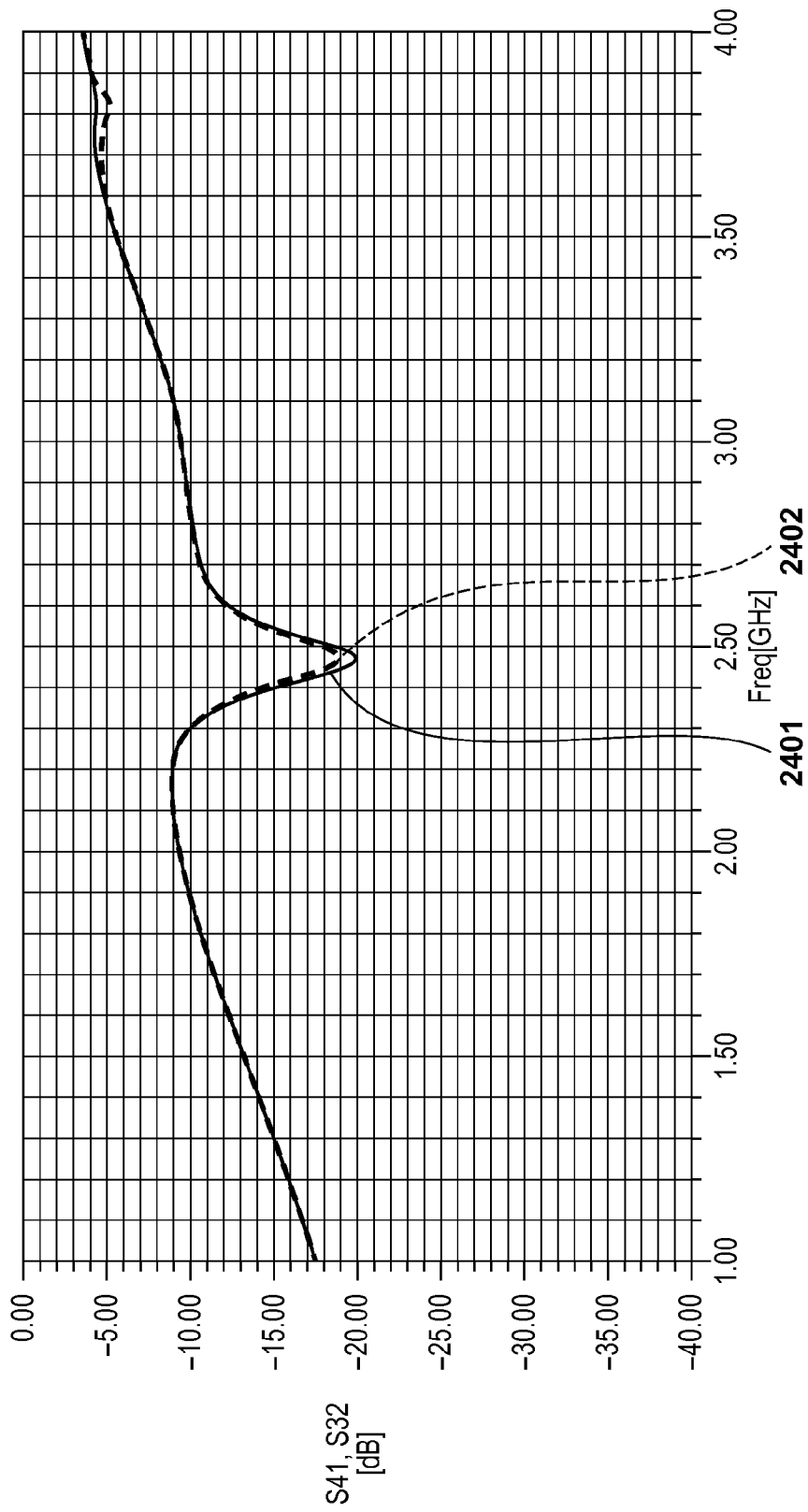
FIG. 24 is a graph showing the transmission coefficients of electromagnetic waves transmitted through adjacent signal lines in the circuit in FIGS. 20A and 20B.

FIGS. 23 and 24 respectively show analysis results on a transmission coefficient S41 of electromagnetic waves propagating between ports 1 and 4 and a transmission coefficient S32 of electromagnetic waves propagating between ports 2 and 3 in each of the arrangements in FIGS. 19A to 19C and FIGS. 20A and 20B. Referring to FIG. 23, a solid curve denoted by reference numeral 2301 indicates the analysis result on S41 concerning the electronic recruit in FIGS. 19A to 19C, and a broken curve denoted by reference numeral 2302 indicates the analysis result on S32 concerning the electronic circuit in FIGS. 19A to 19C. Likewise, referring to FIG. 24, a solid curve denoted by reference numeral 2401 indicates the analysis result on S41 concerning the electronic recruit in FIGS. 20A and 20B, and a broken curve denoted by reference numeral 2402 indicates the analysis result on S32 concerning the electronic circuit in FIGS. 20A and 20B.

It is obvious from FIG. 23 that in the arrangement in FIGS. 19A to 19C, since both S41 and S32 indicate about −26 dB in the 2.4 GHz band, almost no electromagnetic waves propagate to the adjacent signal lines. In addition, FIG. 24 shows that in the arrangement in FIGS. 20A and 20B, both S41 and S32 indicate about −20 dB in the 2.4 GHz band.

The peak of the cutoff frequency of each of the transmission coefficients S41 and S32 in FIG. 23 is 2.43 GHz, and the peak of the cutoff frequency of each of the transmission coefficients S41 and S32 in FIG. 24 is 2.46 GHz. Obviously, there is almost no change in frequency. This also indicates that the EBG structure shown in FIGS. 19A to 19C is resistant to the influence of a conductor arranged near the structure.

Note that the EBG structure in FIGS. 19A to 19C is arranged to protrude from the two signal lines in the X-axis direction. However, on many general electronic circuit substrates, the number of signal lines is not limited to two, and three or more signal lines are arranged side by side. For this reason, when considering an EBG structure applied to a plurality of signal lines, the EBG structure in FIGS. 19A to 19C can be arranged without decreasing the mounting area of a substrate.

Note that like the arrangement in FIGS. 7A to 7C according to the second embodiment, part of the EBG structure in FIGS. 19A to 19C may be arranged on the same layer on which the ground conductor 1903 is arranged.

In addition, in the EBG structure in FIGS. 19A to 19C, the conductors 1906 and 1907 are arranged to overlap both the signal lines 1901 and 1902. However, they may be arranged to overlap only one signal line. Furthermore, in the arrangement in FIGS. 19A to 19C, the conductors 1906 and 1907 are formed in a meander shape. However, the shape of each conductor is not limited to a meander shape and may be a shape such as a line shape or spiral shape. In addition, in the arrangement in FIGS. 19A to 19C, the conductors 1904 and 1905 are arranged to entirely overlap the signal lines 1901 and 1902, respectively. However, only part of each conductor may overlap a corresponding one of the signal lines. Furthermore, in order to ensure a sufficient conductor length of each of the conductors 1904 and 1905, each of the conductors may be formed into a meander shape or spiral shape in the arrangement in FIGS. 19A to 19C. In addition, although the signal lines 1901 and 1902 are formed on the first layer (front surface) of the substrate in the arrangement in FIGS. 19A to 19C, the signal lines may be arranged on an inner layer instead of the front or back surface of the substrate.

Note that in each embodiment described above, the signal lines and the conductors forming the EBG structure have line shapes. In this case, a conductor having a line shape is actually a concept including a conductor plate having a predetermined width. That is, when a conductor plate having a predetermined width is arranged in a linear or curved form by sufficiently increasing the width, the conductor is expressed as having a line shape.

Note that in each embodiment described above, the signal lines and the EBG structure are arranged on the different layers. However, at least part of the EBG structure may be arranged on the same layer on which the signal lines are arranged.

In addition, in each embodiment described above, the EBG structure is designed to cut off electromagnetic waves in the 2.4 GHz band, which is the wireless LAN frequency band. However, it is possible to design EBG structures in accordance with various cutoff frequencies by changing the conductor length. In addition, each embodiment described above has exemplified the case in which microstrip lines are used as signal lines. However, it is possible to use other types of signal transmission lines such as waveguides, coplanar transmission lines, and strip transmission lines. Furthermore, each embodiment described above is implemented by the arrangement in which the EBG structure is formed in the dielectric substrate. However, a member other than a dielectric substrate may be used. For example, an EBG structure may be arranged in a high dielectric substrate such as a ceramic substrate or may be arranged in a flexible cable.

According to the present invention, it is possible to implement an electronic circuit having a compact electromagnetic band gap structure which independently acts on each of a plurality of signal lines.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-209394, filed Oct. 10, 2014, which is hereby incorporated by reference herein in its entirety.

What is claimed is:

1. An electronic circuit comprising:
   at least two first conductors having line shapes which are arranged on a first plane of a substrate;
   a second conductor arranged on a second plane of the substrate; and
   a third conductor having a line shape, with at least a part thereof being arranged on a third plane between the first plane and the second plane of the substrate,
   wherein the third conductor is arranged such that the part, in the third plane, at least partly overlaps one of the at least two first conductors and does not overlap another one of the at least two first conductors when viewed from a direction perpendicular to the substrate, while the part includes an open end of the third conductor, and wherein each of the at least two first conductors is a signal line and the second conductor is a ground conductor, and
   wherein the third conductor includes a portion different from the part which is arranged on a fourth plane between the third plane and the second plane.

2. The circuit according to claim 1, wherein the part of the third conductor arranged on the third plane at least partly has one of a meander shape and a spiral shape.

3. The circuit according to claim 1, wherein two or more of the third conductors respectively corresponding to the at least two first conductors are comprised in the circuit.

4. The circuit according to claim 1, wherein the portion is connected to the second conductor.

5. The circuit according to claim 1, wherein the portion includes a second open end different from the open end of the third conductor.

6. The circuit according to claim 1, wherein the portion is arranged to overlap the one of the at least two first conductors and not to overlap the another one of the at least two first conductors when viewed from the direction perpendicular to the substrate.

7. The circuit according to claim 1, wherein the portion includes a portion which overlaps each of the at least two first conductors when viewed from the direction perpendicular to the substrate.

8. The circuit according to claim 1, wherein the portion at least partly has one of a meander shape and a spiral shape.

9. An electronic circuit comprising:
   at least two first conductors having line shapes which are arranged on a first plane of a substrate;
   a second conductor arranged on a second plane of the substrate; and
   a third conductor having a line shape arranged between the first plane and the second plane of the substrate,
   wherein one of end portions of the third conductor is connected to one of the at least two first conductors and the other of the end portions is an open end which is arranged nearer to the second plane than the first plane, and wherein each of the at least two first conductors is a signal line and the second conductor is a ground conductor, and
   wherein the third conductor at least partly has one of a meander shape and a spiral shape.

10. An electronic circuit comprising:
    at least two first conductors having line shapes which are arranged on a first plane of a substrate;
    a second conductor arranged on a second plane of the substrate; and
    a third conductor having a line shape, with at least a part thereof being arranged on a third plane between the first plane and the second plane of the substrate,
    wherein two end portions of the third conductor are connected to the second conductor, and the part is arranged on the third plane to at least partly overlap one of the at least two first conductors and not to overlap another one of the at least two first conductors when viewed from a direction perpendicular to the substrate, and wherein each of the at least two first conductors is a signal line, the second conductor is a ground conductor, and the third conductor does not connect to any one of the at least two first conductors, and
    wherein the third conductor at least partly has one of a meander shape and a spiral shape.

11. The circuit according to claim 10, wherein the third conductor includes a portion different from the part, which is arranged on a fourth plane between the third plane and the second plane.

12. The circuit according to claim 10, wherein the third conductor includes a portion different from the part, which is arranged on the second plane.

13. An electronic circuit comprising:
    at least two first conductors having line shapes which are arranged on a first plane of a substrate;
    a second conductor arranged on a second plane of the substrate; and
    a third conductor having a line shape, with at least a part thereof being arranged on a third plane between the first plane and the second plane of the substrate,
    wherein the third conductor is arranged such that the part, in the third plane, at least partly overlaps one of the at least two first conductors and does not overlap another one of the at least two first conductors when viewed from a direction perpendicular to the substrate, while the part includes an open end of the third conductor, and wherein each of the at least two first conductors is a signal line and the second conductor is a ground conductor, and
    wherein the third conductor includes a portion different from the part which is arranged on the second plane.

14. The circuit according to claim 13, wherein two or more of the third conductors respectively corresponding to the at least two first conductors are comprised in the circuit.

15. The circuit according to claim 13, wherein the part of the third conductor arranged on the third plane at least partly has one of a meander shape and a spiral shape.

16. The circuit according to claim 13, wherein the portion at least partly has one of a meander shape and a spiral shape.

17. The circuit according to claim 13, wherein the portion includes a portion which overlaps each of the at least two first conductors when viewed from the direction perpendicular to the substrate.

18. The circuit according to claim 13, wherein the portion is connected to the second conductor.

19. The circuit according to claim 13, wherein the portion includes a second open end different from the open end of the third conductor.

20. The circuit according to claim 13, wherein the portion is arranged to overlap the one of the at least two first conductors and not to overlap the another one of the at least two first conductors when viewed from the direction perpendicular to the substrate.

* * * * *